US010679996B2

(12) United States Patent
Yuki et al.

(10) Patent No.: US 10,679,996 B2
(45) Date of Patent: Jun. 9, 2020

(54) CONSTRUCTION OF INTEGRATED CIRCUITRY AND A DRAM CONSTRUCTION

(71) Applicant: Micron Technology, Inc., Boise, ID (US)

(72) Inventors: Kazuyoshi Yuki, Tokyo (JP); Takayoshi Tashiro, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/858,263

(22) Filed: Dec. 29, 2017

(65) Prior Publication Data

US 2019/0206876 A1 Jul. 4, 2019

(51) Int. Cl.
*H01L 27/108* (2006.01)
*G11C 5/10* (2006.01)
*G11C 11/402* (2006.01)

(52) U.S. Cl.
CPC ......... *H01L 27/10897* (2013.01); *G11C 5/10* (2013.01); *G11C 11/4023* (2013.01); *H01L 27/10814* (2013.01); *H01L 27/10847* (2013.01); *H01L 27/10852* (2013.01); *H01L 27/10885* (2013.01); *H01L 27/10888* (2013.01); *H01L 27/10891* (2013.01)

(58) Field of Classification Search
CPC ......... H01L 27/10897; H01L 27/10847; G11C 5/10; G11C 11/4023
USPC ........................................................ 257/296
See application file for complete search history.

(56) References Cited

U.S. PATENT DOCUMENTS

| 9,728,547 | B1 * | 8/2017 | Ohsaki | ............. | H01L 21/02178 |
| 10,163,704 | B2 * | 12/2018 | Chen | ................... | H01L 29/6656 |
| 10,177,133 | B2 * | 1/2019 | Young | ................. | H01L 27/0207 |

(Continued)

FOREIGN PATENT DOCUMENTS

| KR | 10-2004-0002234 | 4/2004 |
| KR | 10-2017-0025859 | 3/2017 |
| WO | WO PCT/US2018/055410 | 4/2019 |

*Primary Examiner* — Mohammad M Hoque
(74) *Attorney, Agent, or Firm* — Wells St. John P.S.

(57) ABSTRACT

A construction of integrated circuitry comprises a structure comprising conductive material having insulative material there-above. The conductive material and the insulative material respectively have opposing sides in a vertical cross-section. A first insulating material is laterally outward of the opposing sides of the conductive material in the vertical cross-section. A second insulating material is laterally outward of the first insulating material in the vertical cross-section. The second insulating material is of different composition from that of the first insulating material. The second insulating material laterally covers a lower portion of the opposing sides of the insulative material in the vertical cross-section. The second insulating material does not laterally cover an upper portion of the opposing sides of the insulative material in the vertical cross-section. A third insulating material is laterally outward of the second insulating material in the vertical cross-section. The third insulating material is of different composition from that of the second insulating material. The third insulating material laterally covers the lower portion and the upper portion of the opposing sides of the insulative material in the vertical cross-section.

22 Claims, 24 Drawing Sheets

(56) References Cited

U.S. PATENT DOCUMENTS

| | | | |
|---|---|---|---|
| 2001/0001726 A1* | 5/2001 | Pan | H01L 21/32051 438/597 |
| 2008/0116583 A1* | 5/2008 | Yuki | H01L 21/28525 257/774 |
| 2012/0276711 A1* | 11/2012 | Yoon | H01L 21/764 438/421 |
| 2014/0054659 A1 | 2/2014 | Seo | |
| 2014/0061736 A1 | 3/2014 | Hwang et al. | |
| 2017/0062347 A1* | 3/2017 | Kim | H01L 23/4821 |
| 2017/0338280 A1 | 11/2017 | Frost et al. | |

* cited by examiner

CONSTRUCTION OF INTEGRATED CIRCUITRY AND A DRAM CONSTRUCTION

TECHNICAL FIELD

Embodiments disclosed herein pertain to a construction of integrated circuitry and to a DRAM construction.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or nonvolatile. Nonvolatile memory cells can store data for extended periods of time in the absence of power. Nonvolatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

One type of memory cell has at least one transistor and at least one capacitor. In some such structures, one conductive via extends downwardly from a sense line to one source/drain region (e.g., a circuit node) of the transistor. Additionally, another conductive via may be laterally-adjacent the one conductive via and extend downwardly from a storage node of the capacitor to another source/drain region of the same or another transistor. Unfortunately, parasitic capacitance exists laterally between the one conductive via and the other conductive via. Such parasitic capacitance can adversely affect circuit performance. Parasitic capacitance laterally between conductive vias in other circuitry can also adversely affect circuit performance. Parasitic capacitance may be reduced, for example, by using a combination of silicon nitride and silicon dioxide as insulative materials laterally between adjacent conductive vias. However, in circumstances where other regions of silicon dioxide are etched, that silicon dioxide that is laterally between adjacent conductive vias may also be undesirably etched if it is exposed to the etching conditions. This can possibly lead to electrical shorting of the laterally-adjacent conductive vias when conductive material is subsequently deposited.

While the invention was motivated in addressing and overcoming the above identified issues, it is not necessarily so limited.

DETAILED DESCRIPTION OF EXAMPLE EMBODIMENTS

Embodiments of the invention encompass constructions of integrated circuitry including, for example, a DRAM construction, and may encompass methods of forming constructions of integrated circuitry. Example embodiments are initially described with reference to FIGS. 1-6. Such show an example fragment of a substrate construction 8 comprising an array or array area 10 that in one embodiment may comprise memory cells (e.g., DRAM cells) that have been fabricated relative to a base substrate 11. Substrate 11 may comprise any one or more of conductive/conductor/conducting (i.e., electrically herein), semiconductive/semiconductor/semiconducting, and insulative/insulator/insulating (i.e., electrically herein) materials. Various materials are above base substrate 11. Materials may be aside, elevationally inward, or elevationally outward of the FIGS. 1-6—depicted materials. For example, other partially or wholly fabricated components of integrated circuitry may be provided somewhere above, about, or within base substrate 11. Control and/or other peripheral circuitry for operating components within a memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array.

Figure 1:
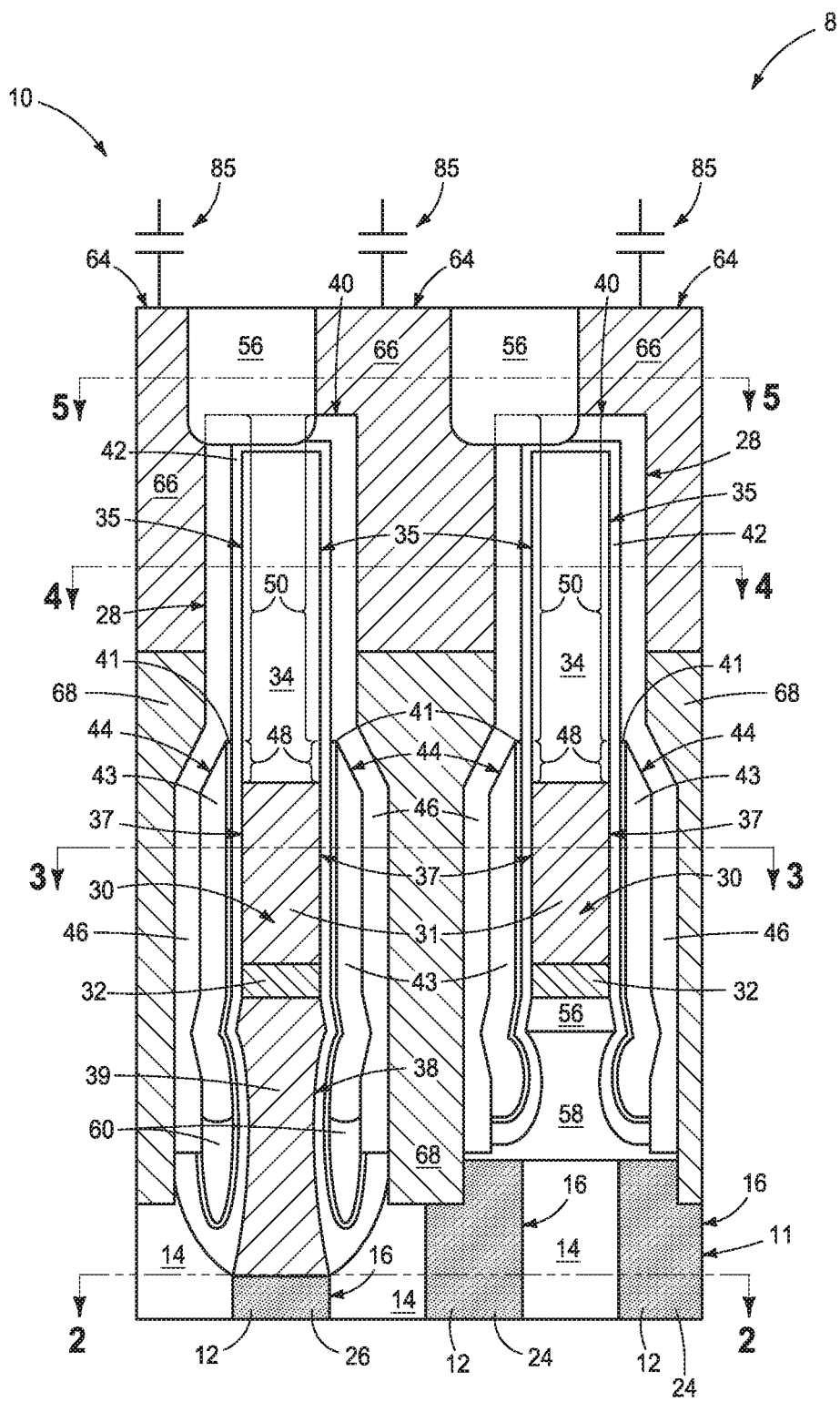
FIG. 1 is a diagrammatic sectional view of a substrate in accordance with an embodiment of the invention, and is taken through lines 1-1 in FIGS. 2-5.
Figure 2:
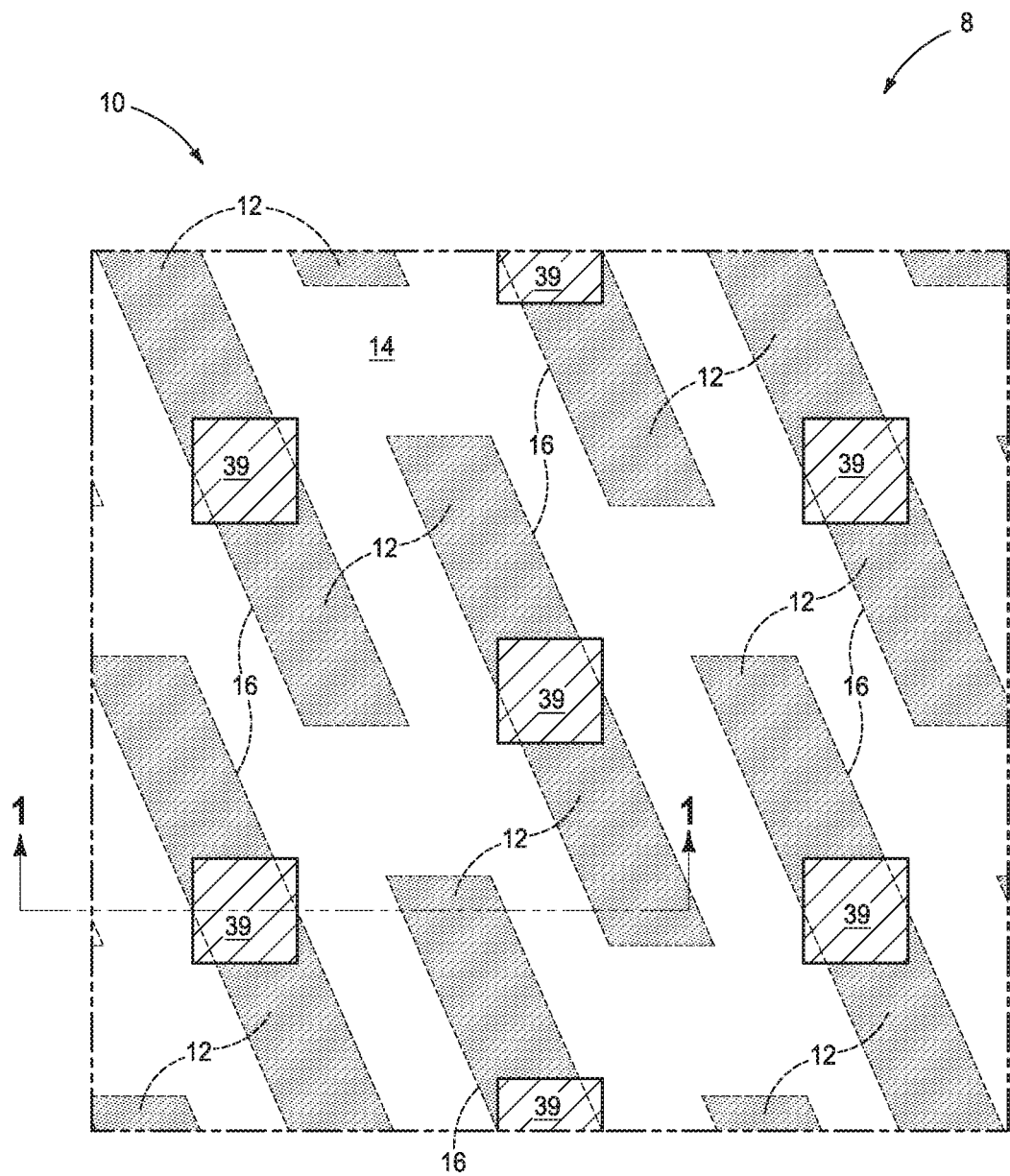
FIG. 2 is a sectional view taken through line 2-2 in FIG. 1.
Figure 3:
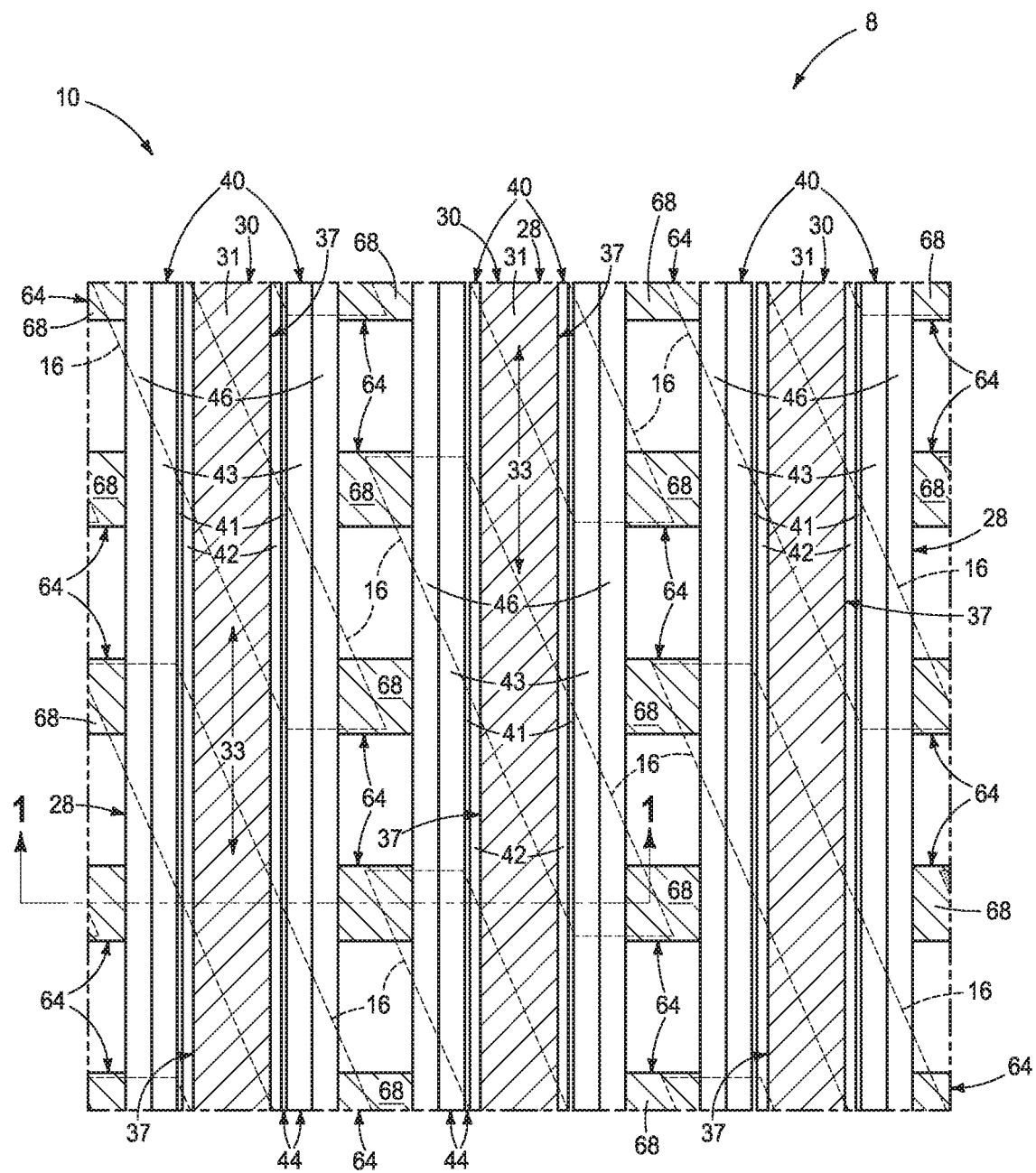
FIG. 3 is a sectional view taken through line 3-3 in FIG. 1.
Figure 4:
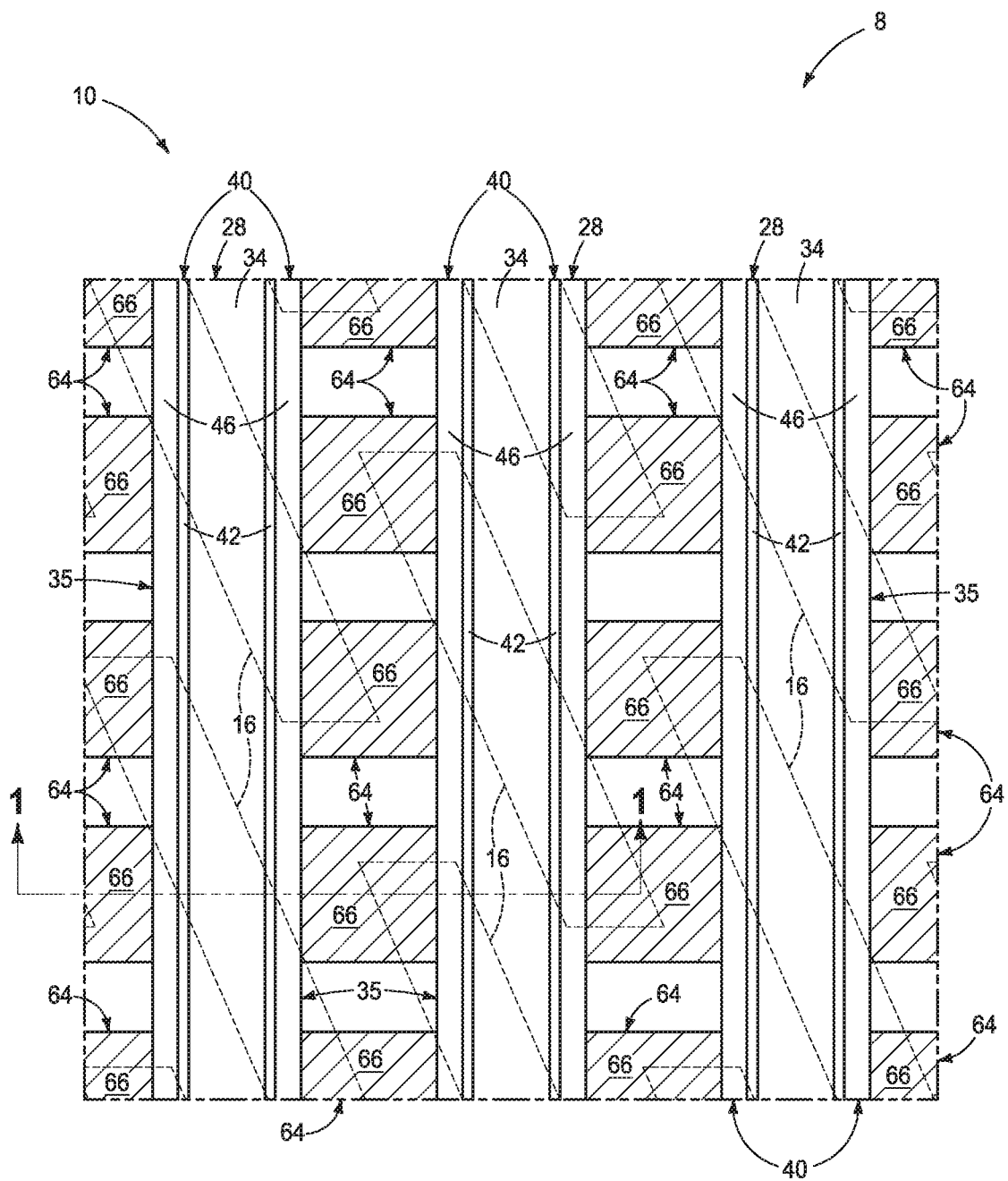
FIG. 4 is a sectional view taken through line 4-4 in FIG. 1.
Figure 5:
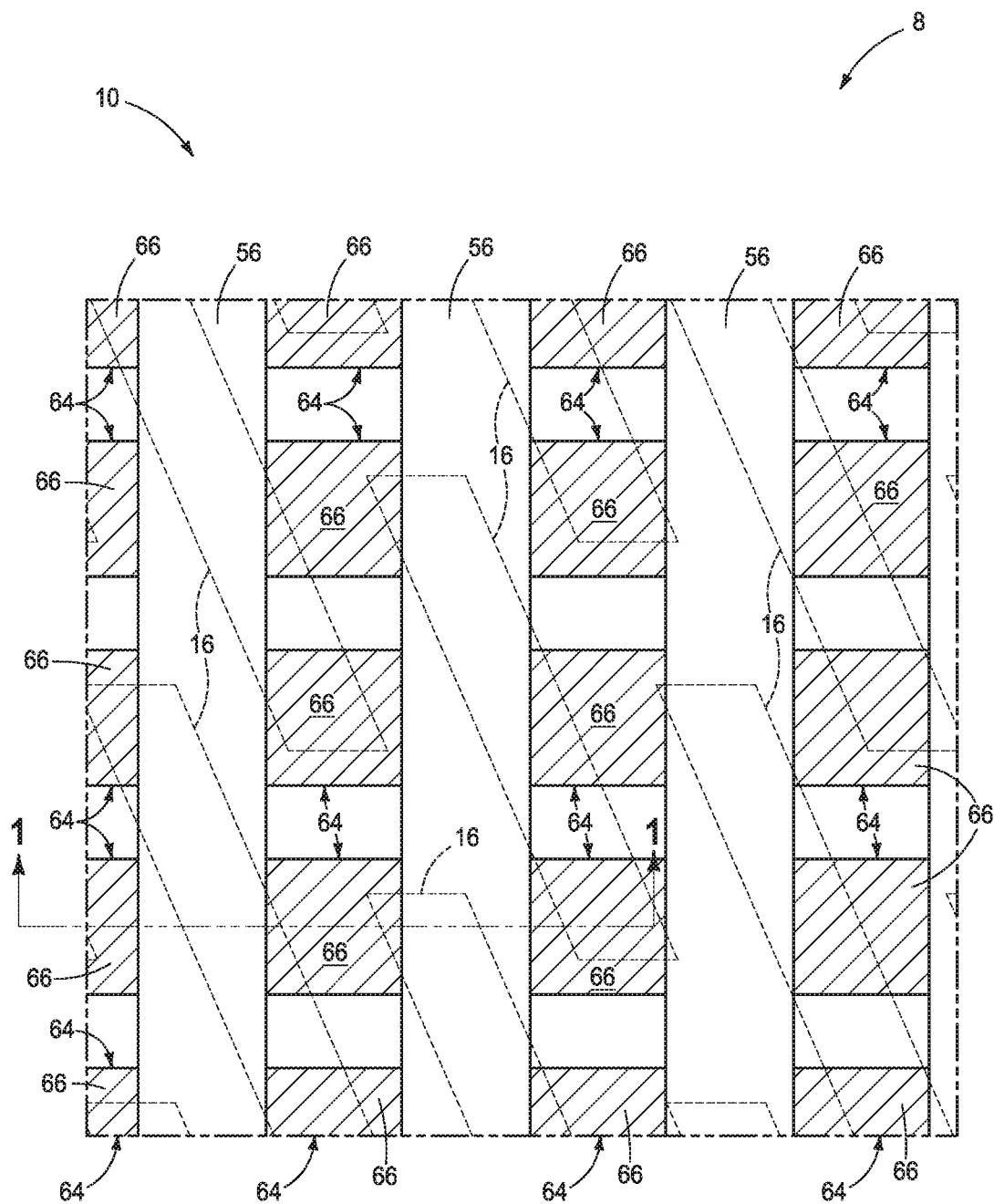
FIG. 5 is a sectional view taken through line 5-5 in FIG. 1.

Base substrate 11 comprises semiconductor material 12 (e.g., appropriately, and variously, doped monocrystalline silicon), trench isolation regions 14 (e.g., silicon nitride and/or doped or undoped silicon dioxide), and active area regions 16 comprising suitably-doped semiconductor material 12. In one embodiment, construction 8 comprises memory cells, for example DRAM memory cells individually comprising a field effect transistor 25 (FIG. 6) and a capacitor 85 (FIG. 1). However, embodiments of the invention encompass other memory cells and other constructions of integrated circuitry. In the depicted example, field effect transistors 25 are shown to be in the form of recessed access devices (RADs). Such include access line constructions 18 (FIG. 6) buried in base substrate 11 (e.g., FIG. 6 being a horizontal cross-section taken below the bottom of base substrate 11 as it is shown in FIG. 1 and being parallel with the horizontal cross-sections of FIGS. 2-5), and which comprise a gate insulator 20 (e.g., comprising, consisting essentially of, or consisting of silicon dioxide and/or silicon nitride) and conductive gate material 22 (e.g., comprising, consisting essentially of, or consisting of conductively-doped semiconductor material and/or metal material). Insulator material may be above access line constructions 18 (e.g., comprising, consisting essentially of, or consisting of silicon nitride and/or doped or undoped silicon dioxide, and not shown). Individual field effect transistors 25 comprise a pair of source/drain regions 24, 26 laterally outward of and higher than access line constructions 18. When suitable voltage is applied to gate material 22 of an access line construction 18, a conductive channel can form within semiconductor material 12 proximate gate insulator 20 such that current is capable of flowing between a pair of source/drain regions 24 and 26 under the access line construction 18 within an individual active area region 16. Thus, in the example embodiment, each active area region 16 comprises two field effect transistors 25 with each sharing a central source/drain region 26. An individual memory cell is encompassed by one of those field effect transistors and one capacitor 85 (including a conductor 64 electrically coupling a respective one of source/drain regions 24 or 26 to the one capacitor 85, as further described below).

Structures/constructions 28 (FIGS. 1, 3, and 4) are above base substrate 11. The discussion proceeds with respect to DRAM construction 8 comprising a pair of immediately-adjacent structures 28, although embodiments of the invention encompass a construction of integrated circuitry (regardless of being DRAM) comprising a single example structure 28 or other structure. Pair of structures 28 individually comprise a conductive line 30 (e.g., a digit line) and insulative material 34 there-above. Conductive line 30 and insulative material 34 have opposing sides 37 and 35, respectively, in a vertical cross-section, for example such as the vertical cross-section shown by FIG. 1. In one embodiment, such vertical cross-section is orthogonal to a longitudinal orientation 33 (FIG. 3) of conductive lines 30. An elevationally-extending conductive via 38 (FIG. 1) is directly under at least one of conductive lines 30 of pair of structures 28 in the vertical cross-section, and in one example only one of conductive lines 30 (the left one in FIG. 1) comprises such an elevationally-extending conductive via 38 the example FIG. 1 vertical cross-section. Example conductive lines 30 are shown as comprising conductive materials 31 and 32, and elevationally-extending conductive via 38 is shown as comprising conductive material 39. Any suitable conductive materials may be used, for example any metal material and/or conductively-doped semiconductive material. Any two or three of materials 31, 32, and 39 may be the same in composition and/or different in composition relative one another. Examples include elemental W for material 31, TiN for material 32, and conductively-doped polysilicon for material 39. An example insulative material 34 is silicon nitride and/or silicon dioxide.

Elevationally-extending-insulator material 40 is along opposing sides 37 of conductive line 30 and opposing sides 35 of insulative material 34 in the vertical cross-section. Insulator material 40 comprises a first insulating material 42 laterally outward of opposing sides 37 of conductive lines 30, and in one embodiment as shown laterally covers all of opposing sides 37 of conductive line 30. In one embodiment, first insulating material 42 is laterally outward of opposing sides 35 of insulative material 34, and in one embodiment as shown laterally covers all of opposing sides 35 of insulative material 34.

Insulator material 40 comprises a second insulating material 44 laterally outward of, and in one embodiment is directly against, first insulating material 42 in the vertical cross-section. Second insulating material 44 is of different composition from that of first insulating material 42. Second insulating material 44 laterally covers a lower portion 48 (FIG. 1), in one embodiment a lowest-most portion 48, of opposing sides 35 of insulative material 34 in the vertical cross-section. Second insulating material 44 does not laterally cover an upper portion 50, and in one embodiment which is an uppermost portion 50, of opposing sides 35 of insulative material 34 in the vertical cross-section. In one embodiment, second insulating material 44 laterally covers all of opposing sides 37 of conductive line 30 in the vertical cross-section.

Insulator material 40 comprises a third insulating material 46 laterally outward of, and in one embodiment directly against, second insulating material 44 in the vertical cross-section. Third insulating material 46 is of different composition from that of second insulating material 44. Third insulating material 46 laterally covers lower portion 48 and upper portion 50 of opposing sides 35 of insulative material 34 in the vertical cross-section. In one embodiment and as shown, third insulating material 46 laterally covers all of opposing sides 37 of conductive line 30 in the vertical cross-section.

In one embodiment, first insulating material 42 and third insulating material 46 are of the same composition. As an example, such each may be or comprise silicon nitride and, for example in some embodiments, with first insulating material 42 being considered as first silicon nitride and third insulating material 46 being considered as second silicon nitride. Regardless, in one embodiment insulative material 34 and first insulating material 42 are of the same composition (e.g., silicon nitride). An example second insulating material 44 comprises silicon dioxide, with example second insulating material 44 being shown as comprising insulating material 41 and insulating material 43 which may be of the same composition or of different compositions relative one another, and in one embodiment with each comprising silicon dioxide.

In one embodiment, second insulating material 44 has a maximum thickness that is greater than that of first insulating material 42, and in one embodiment that is greater than that of third insulating material 46. In one embodiment, third insulating material 46 has a maximum thickness that is greater than that of first insulating material 42. Regardless, any suitable lateral thickness(es) may be used for materials 41, 42, 43, 44, and 46, examples for each being 20 Angstroms to 100 Angstroms.

Example additional insulative materials 56, 58, and 60 are shown in FIG. 1 which may be of the same composition or of different compositions relative one another. As specific examples, materials 56 and 60 may comprise silicon nitride and material 58 may comprise silicon dioxide.

Elevationally-extending-conductor material 64 is laterally between pair of structures 28 and along insulator material 40 in the vertical cross-section. In one embodiment and as shown, conductor material 64 comprises an elevationally-extending conductor storage node via having capacitor 85 directly electrically coupled thereto. Conductor material 64 may comprise any one or more of metal material and/or conductively-doped polysilicon, with in one example and as shown comprising different composition conductive materials 66 (e.g., elemental tungsten) and 68 (e.g., conductively-doped polysilicon).

Figure 6:
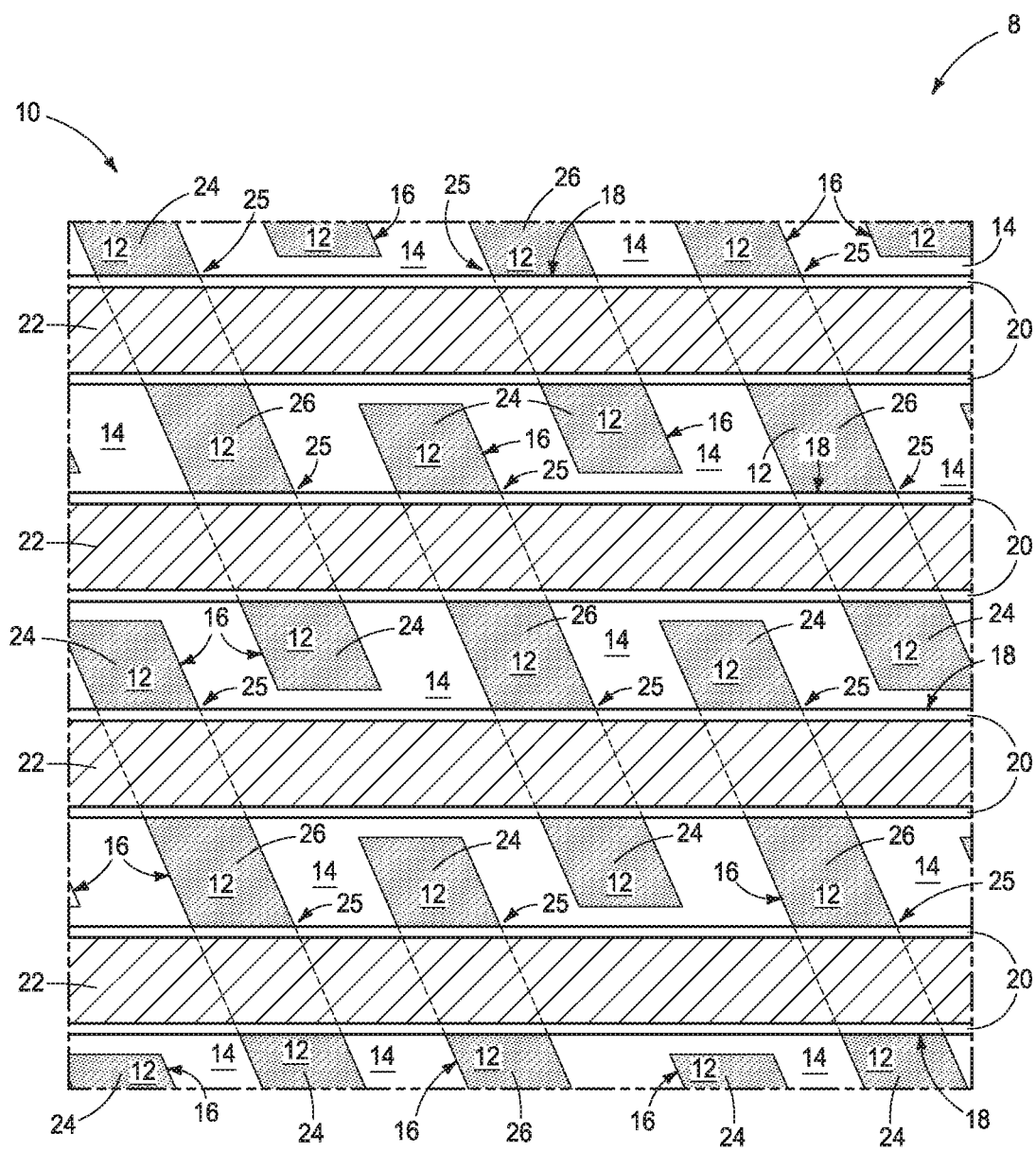
FIG. 6 is a sectional taken below the bottom of the substrate as shown in FIG. 1, and is parallel with the sectional views of FIGS. 2-5.

An example method of forming a construction of integrated circuitry as shown in FIGS. 1-6 is described with reference to FIGS. 7-22. Like numerals from FIGS. 1-6 have been used for predecessor constructions and materials. Example processing would initially proceed to produce a construction as shown in FIG. 6.

Figure 7:
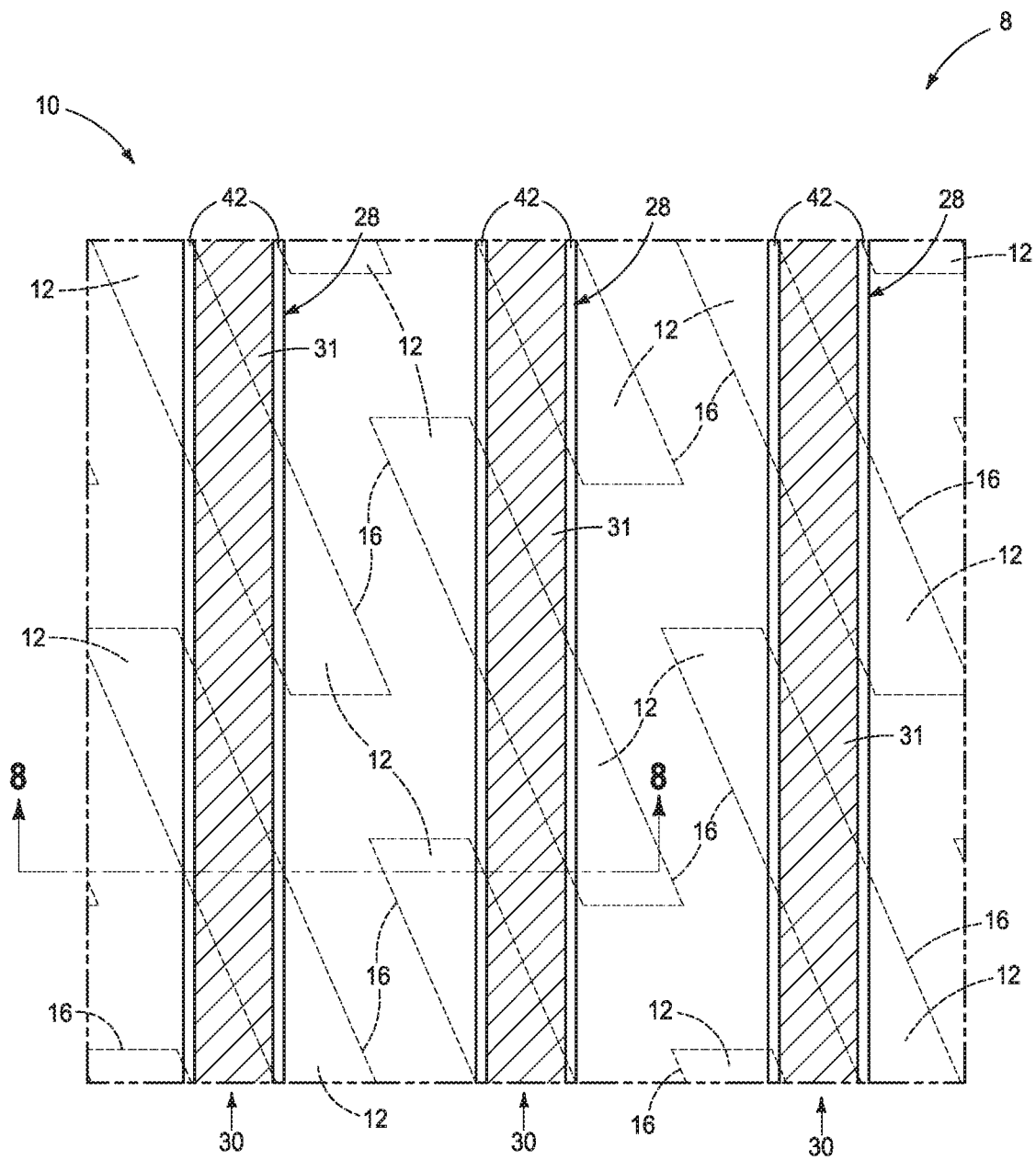
FIG. 7 is a diagrammatic downwardly-looking sectional view of a predecessor substrate to that as shown in FIG. 3 in process in accordance with an embodiment of the invention, and is taken through line 7-7 in FIG. 8.
Figure 8:
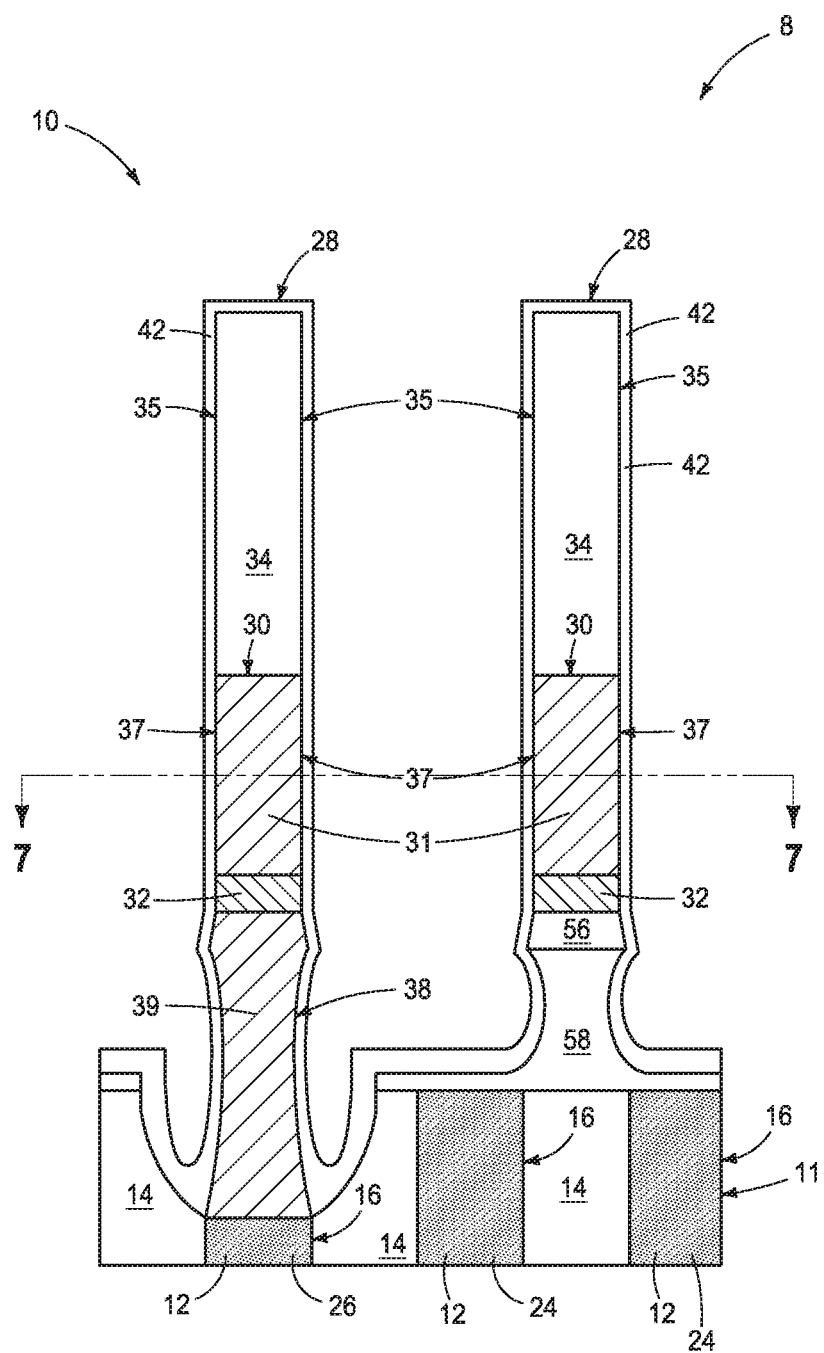
FIG. 8 is a sectional view taken through line 8-8 in FIG. 7.

Referring to FIGS. 7 and 8, predecessor constructions 28 have been formed to a point of comprising first insulating material 42 above conductive lines 30.

Figure 9:
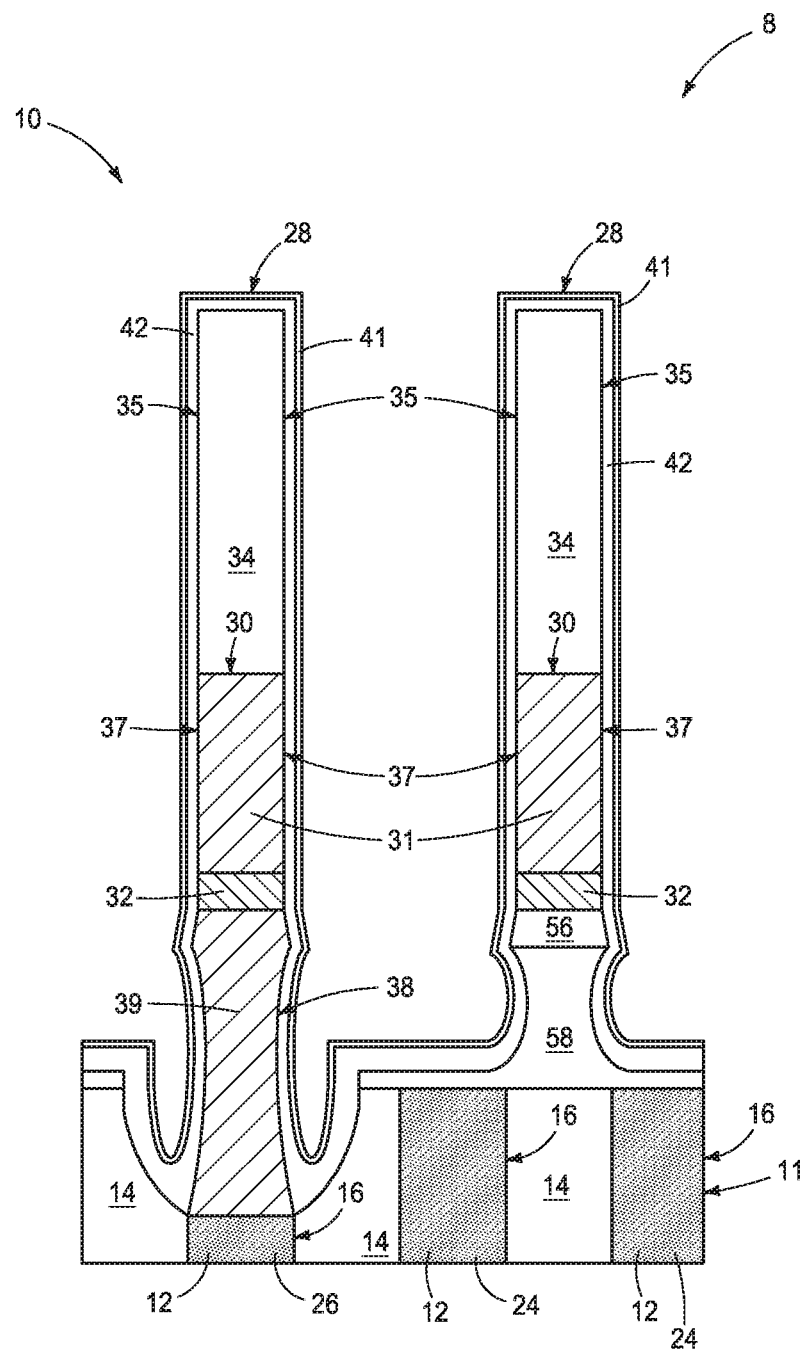
FIG. 9 is a view of the FIG. 8 substrate at a processing step subsequent to that shown by FIG. 8.

Referring to FIG. 9, example silicon dioxide material 41 has been formed, for example, by chemical vapor deposition and/or an ashing step.

Figure 10:
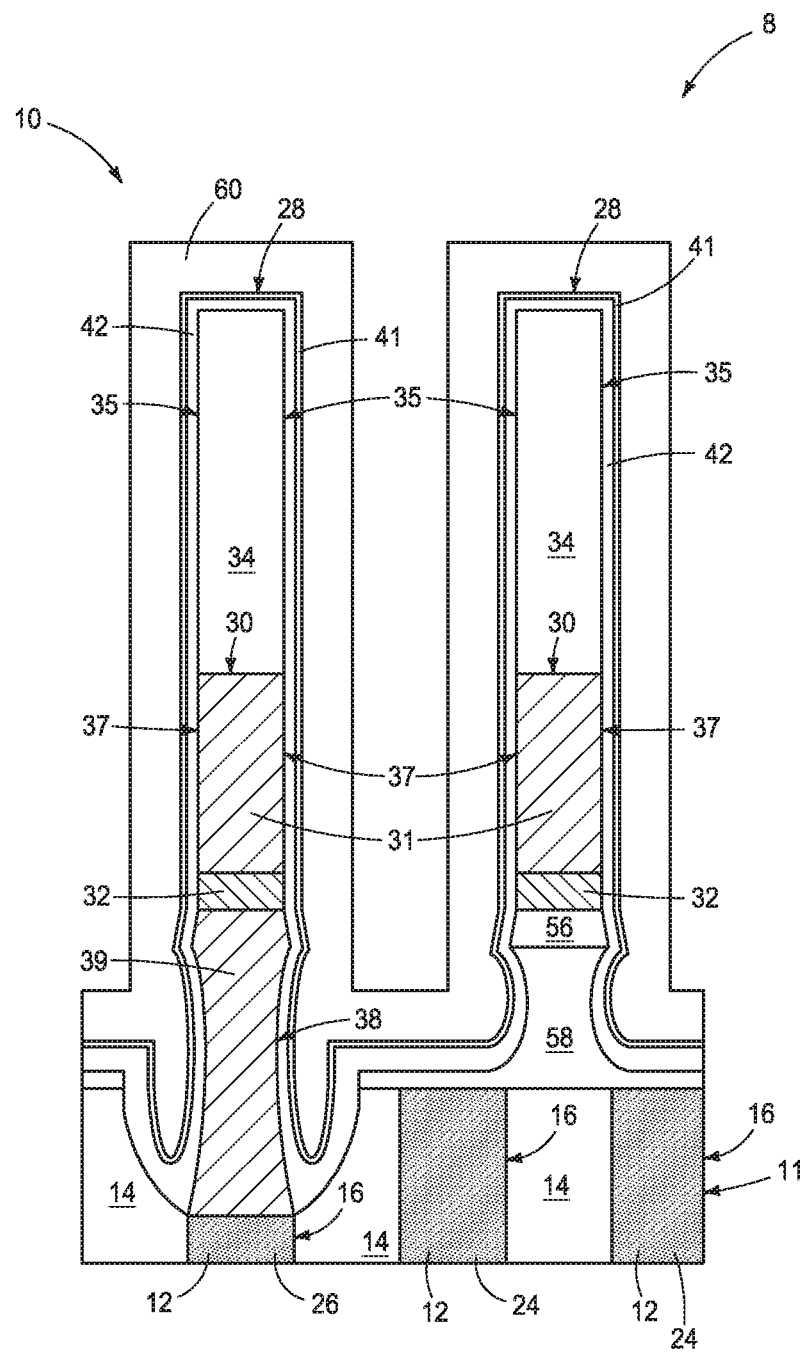
FIG. 10 is a view of the FIG. 9 substrate at a processing step subsequent to that shown by FIG. 9.

Referring to FIG. 10, insulative material 60 has been deposited, for example by chemical vapor deposition to form insulative material 60 to comprise silicon nitride.

Figure 11:
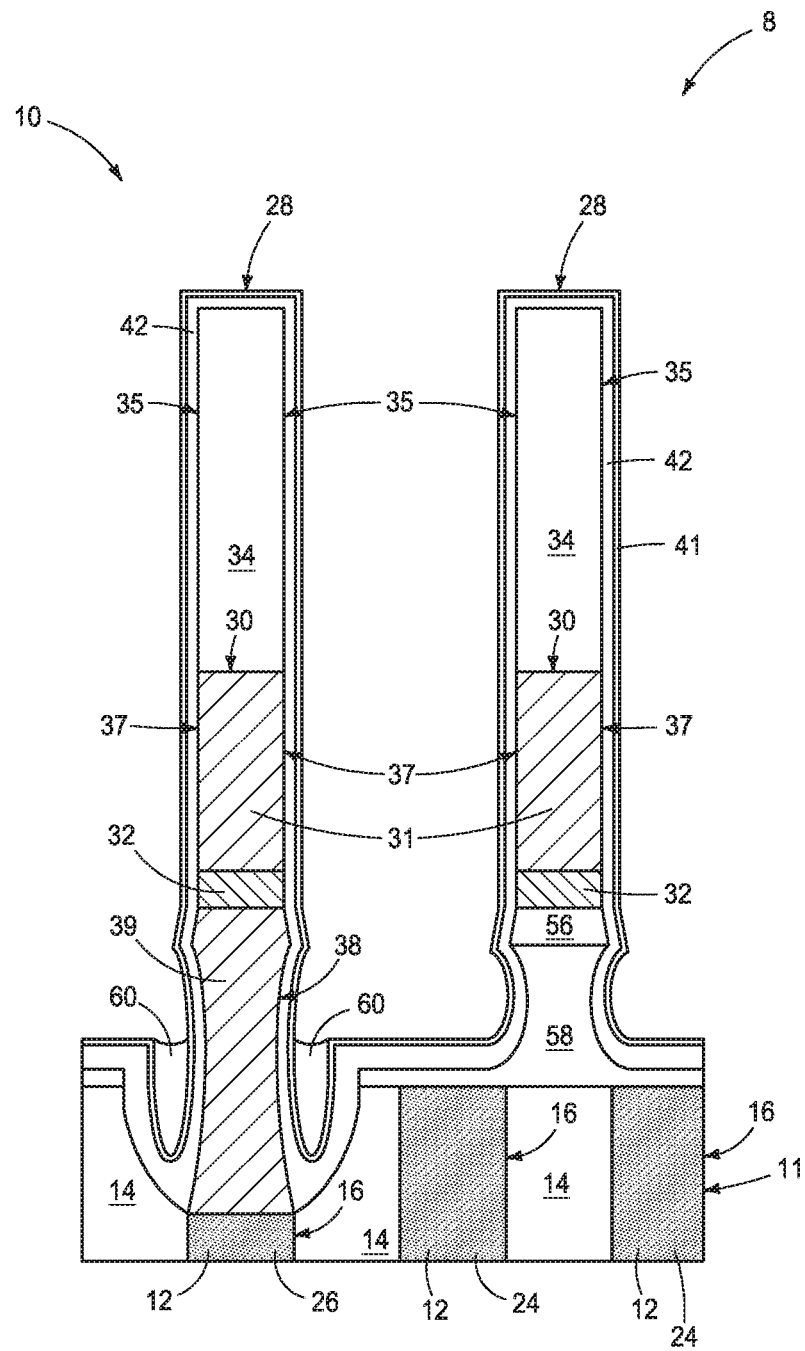
FIG. 11 is a view of the FIG. 10 substrate at a processing step subsequent to that shown by FIG. 10.

Referring to FIG. 11, example silicon nitride material 60 has been subjected to an etch (e.g., wet and using $H_3PO_4$) to produce the example illustrated construction.

Figure 12:
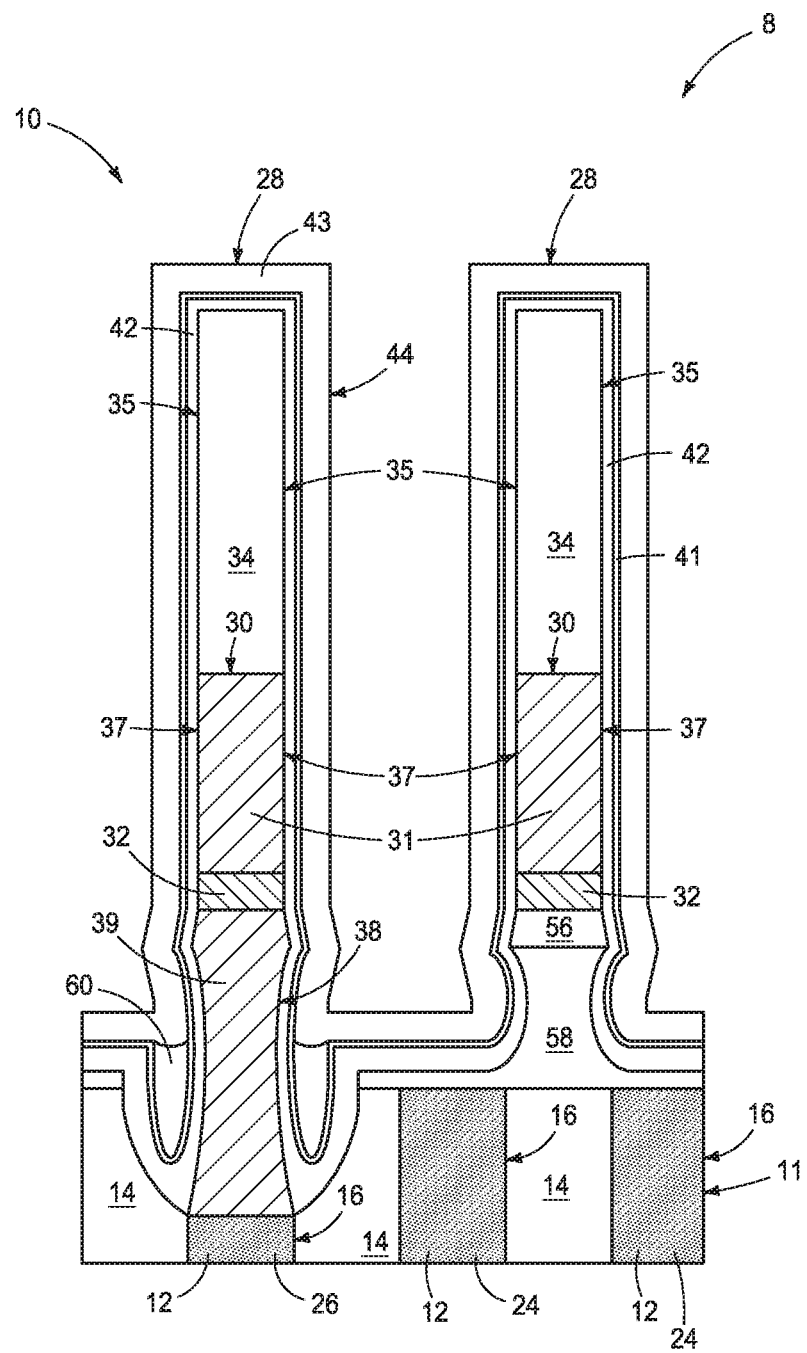
FIG. 12 is a view of the FIG. 11 substrate at a processing step subsequent to that shown by FIG. 11.

Referring to FIG. 12, example silicon dioxide insulative material 43 has been deposited (e.g., by CVD) to form second insulating material 44.

Figure 13:
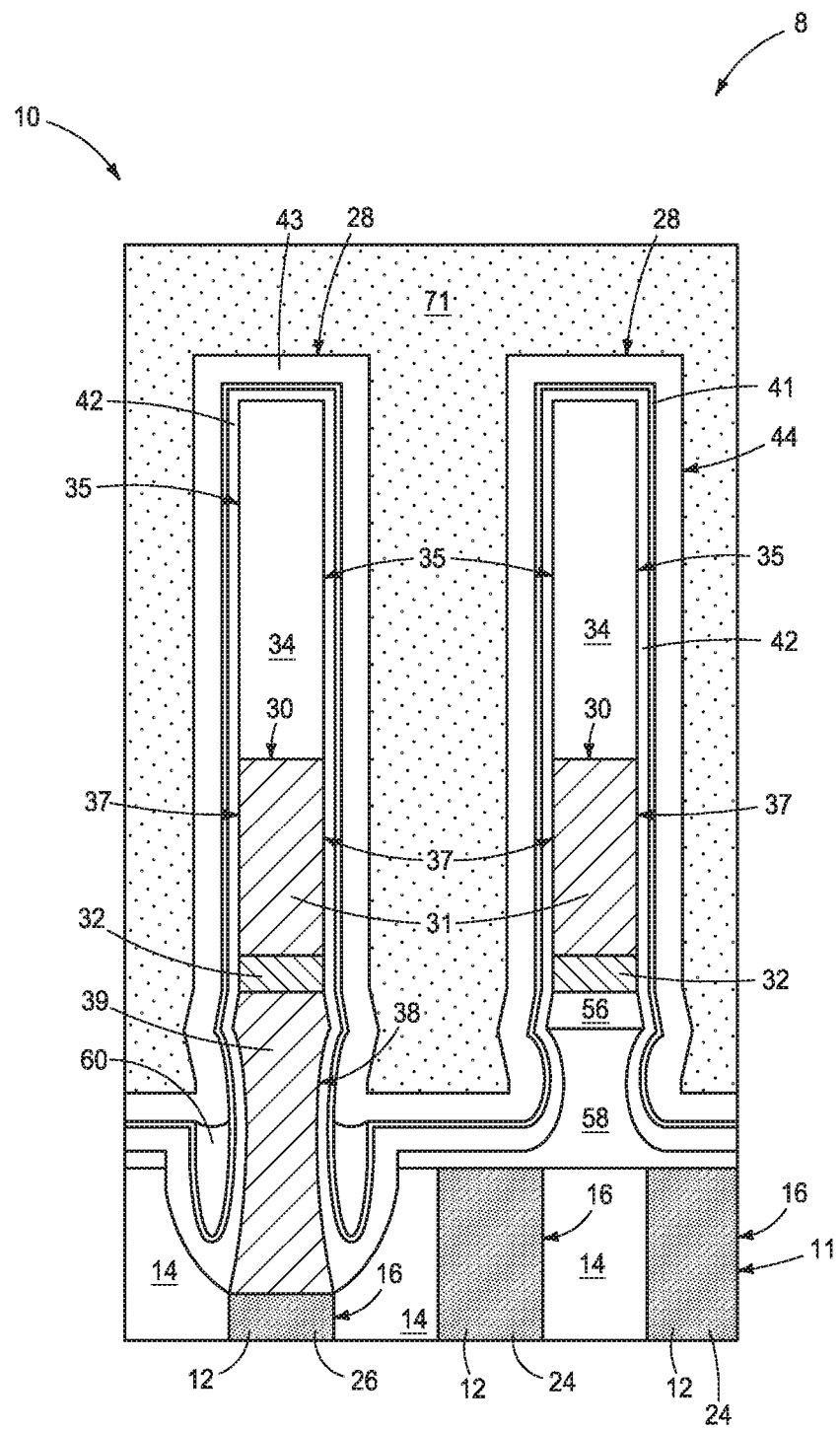
FIG. 13 is a view of the FIG. 12 substrate at a processing step subsequent to that shown by FIG. 12.
Figure 14:
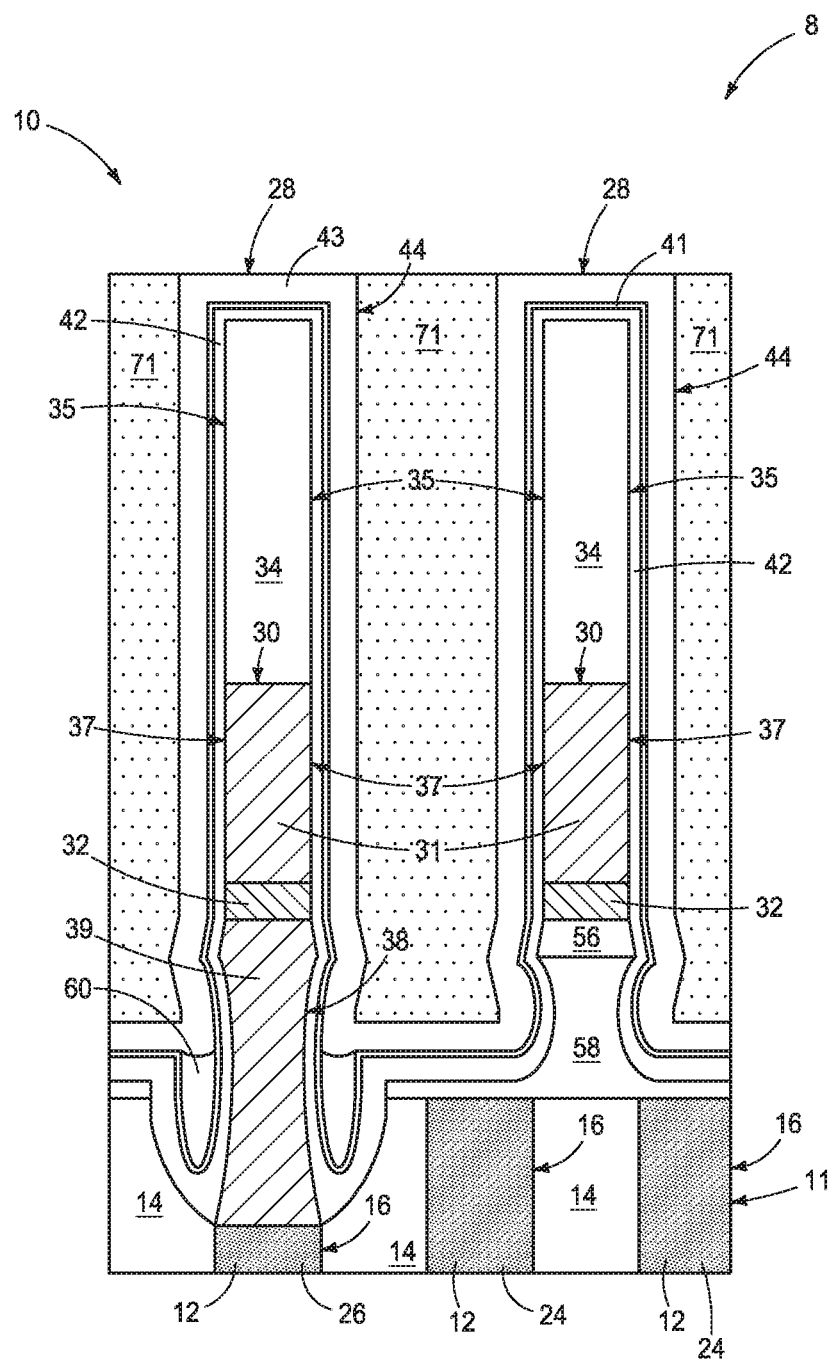
FIG. 14 is a view of the FIG. 13 substrate at a processing step subsequent to that shown by FIG. 13.
Figure 15:
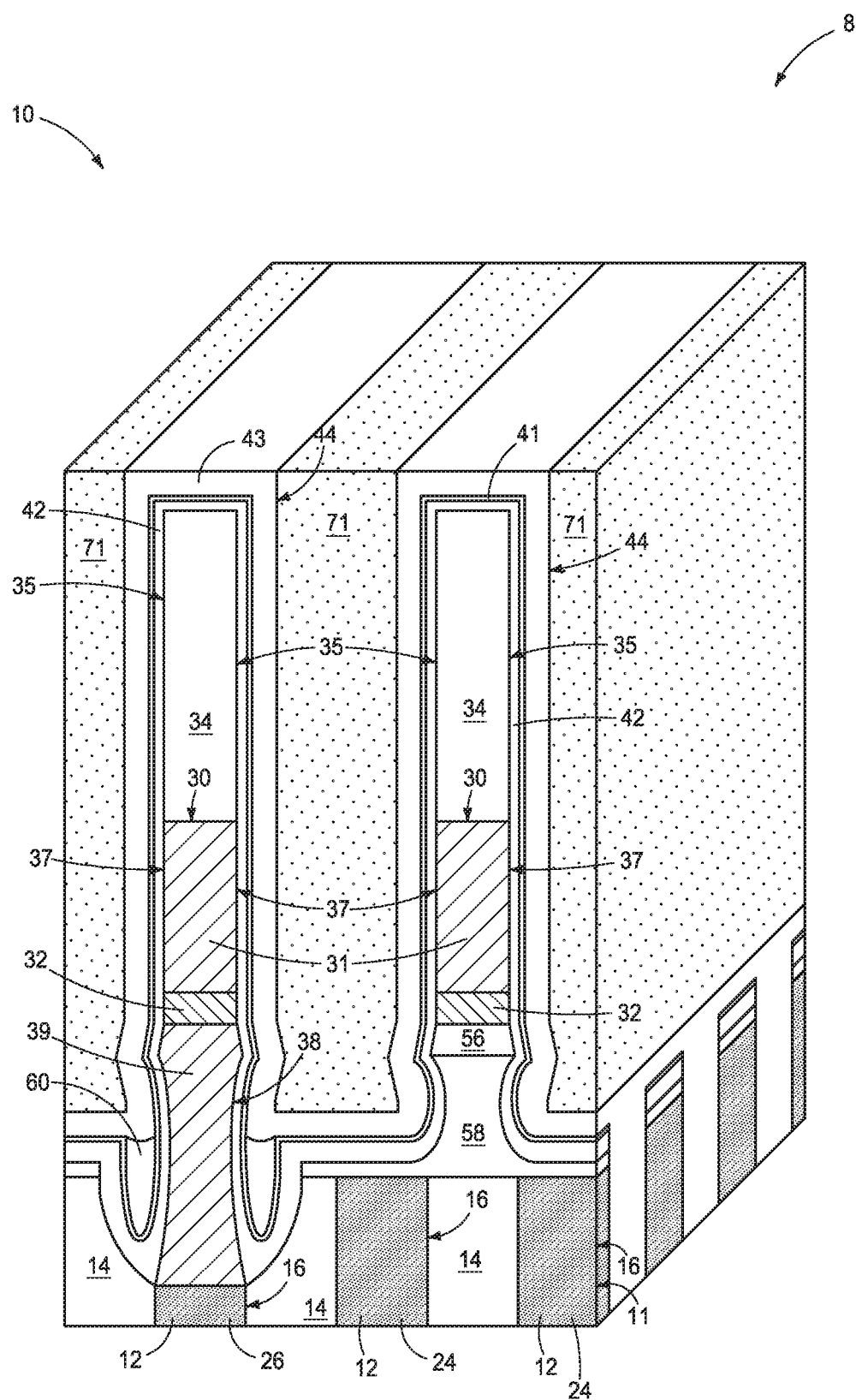
FIG. 15 is a perspective view of the FIG. 14 substrate.

Referring to FIG. 13, a sacrificial material 71 (e.g., undoped polysilicon) has been deposited to fill void space that is between constructions 28. FIGS. 14 and 15 show planarization of sacrificial material 13 back at least to elevationally-outermost surfaces of constructions 28.

Figure 16:
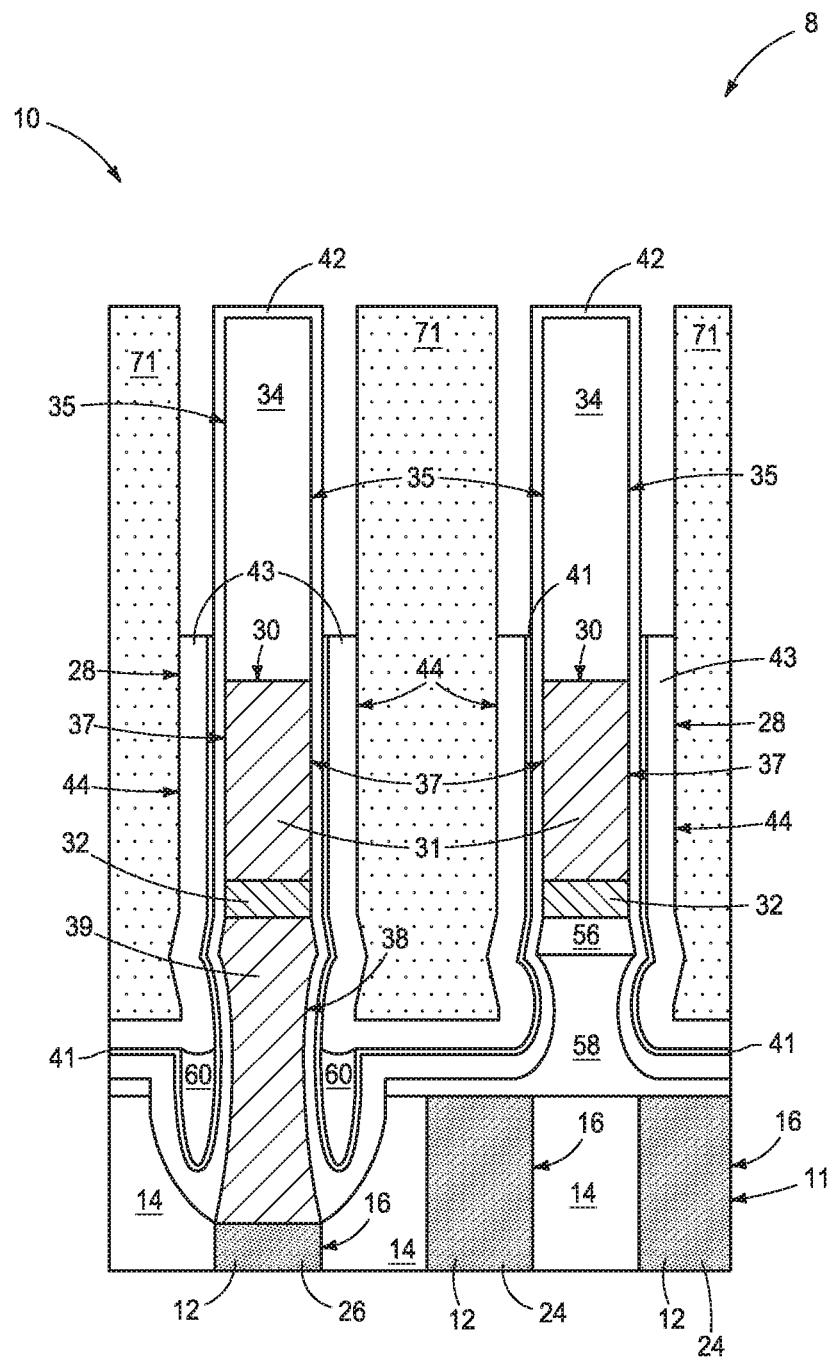
FIG. 16 is a sectional view of the FIG. 14 substrate at a processing step subsequent to that shown by FIG. 14.

Referring to FIG. 16, second insulating material 44 has been etched back, for example selectively relative to example sacrificial polysilicon material 71 and example silicon-nitride first insulating material 42. An example chemistry for doing so includes dilute liquid HF. Sacrifial material 71 covers sidewalls of second insulating material 44 and thereby protects such sidewalls from being directly exposed to the etching fluid during such etching.

Figure 17:
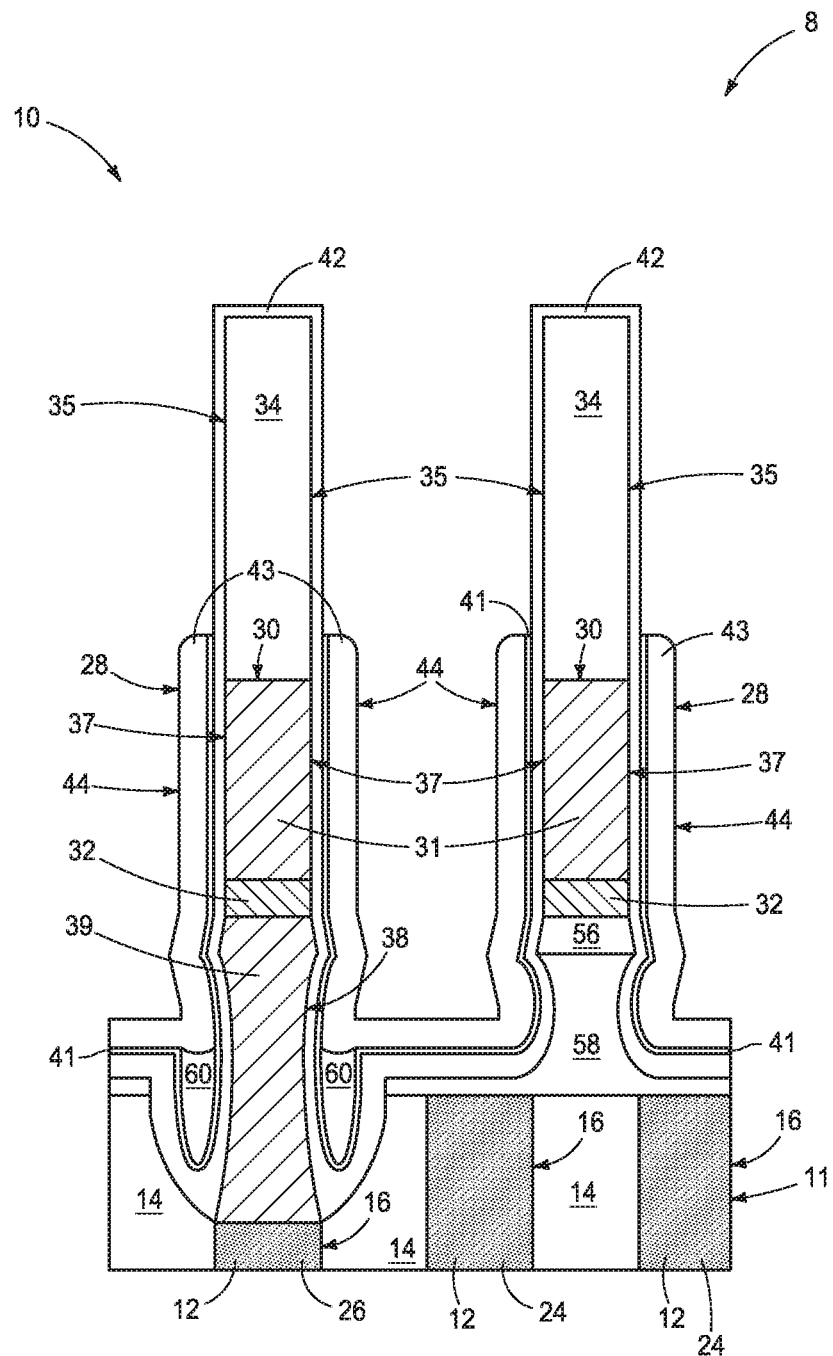
FIG. 17 is a view of the FIG. 16 substrate at a processing step subsequent to that shown by FIG. 16.

Referring to FIG. 17, sacrificial material 71 (not shown) has been removed (e.g., by selective wet etching using ammonia). Such removal of sacrificial material 71 may result in some rounding of elevationally-outermost surfaces of second insulating material 44 as shown.

Figure 18:
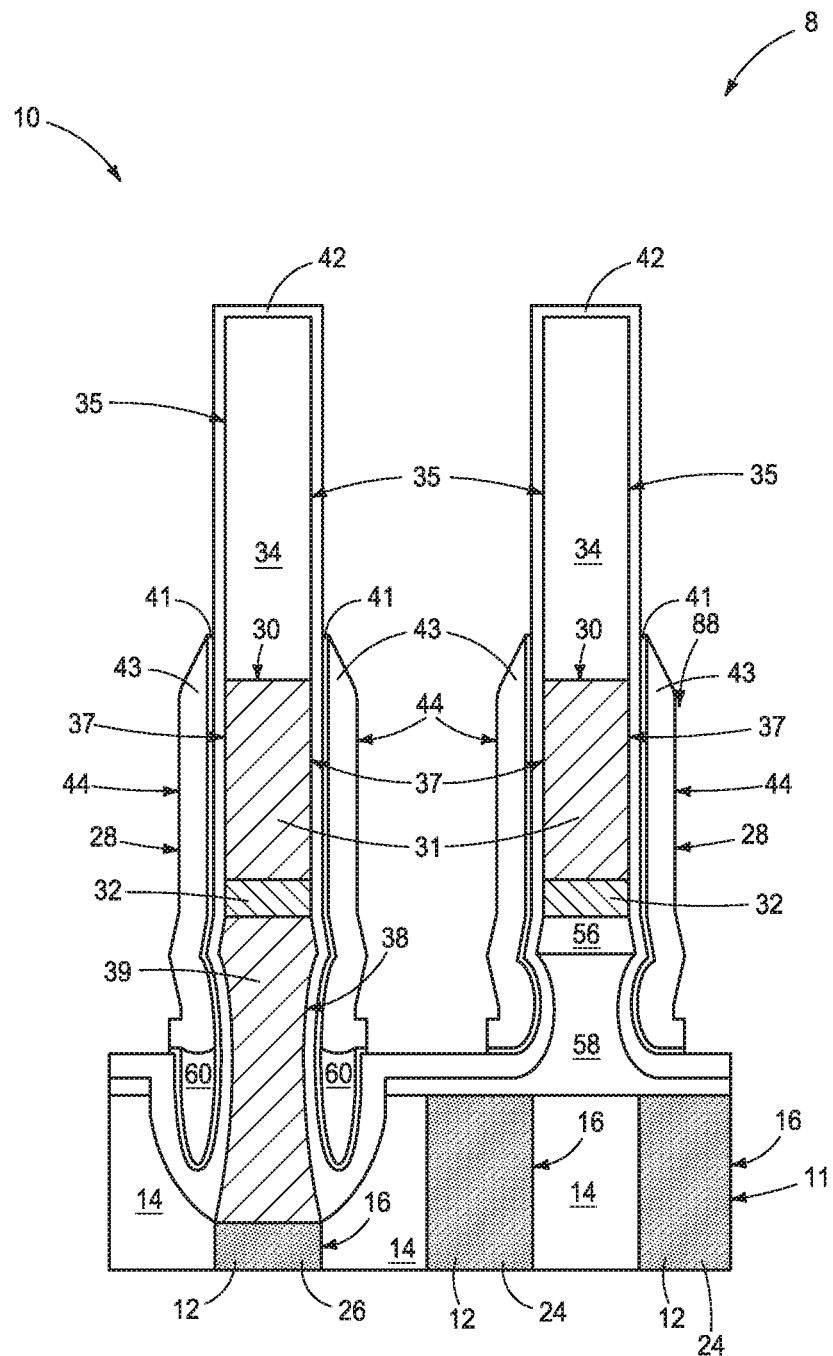
FIG. 18 is a view of the FIG. 17 substrate at a processing step subsequent to that shown by FIG. 17.

Referring to FIG. 18, second insulating material 44 has been anisotropically etched back selectively relative to first insulating material 42 (e.g., using a hydrofluorocarbon-based chemistry where second insulating material 44 is silicon dioxide and first insulating material 42 is silicon nitride). Further erosion or sloping of elevationally-outermost surfaces of second insulating material 44 may occur, for example as shown.

Figure 19:
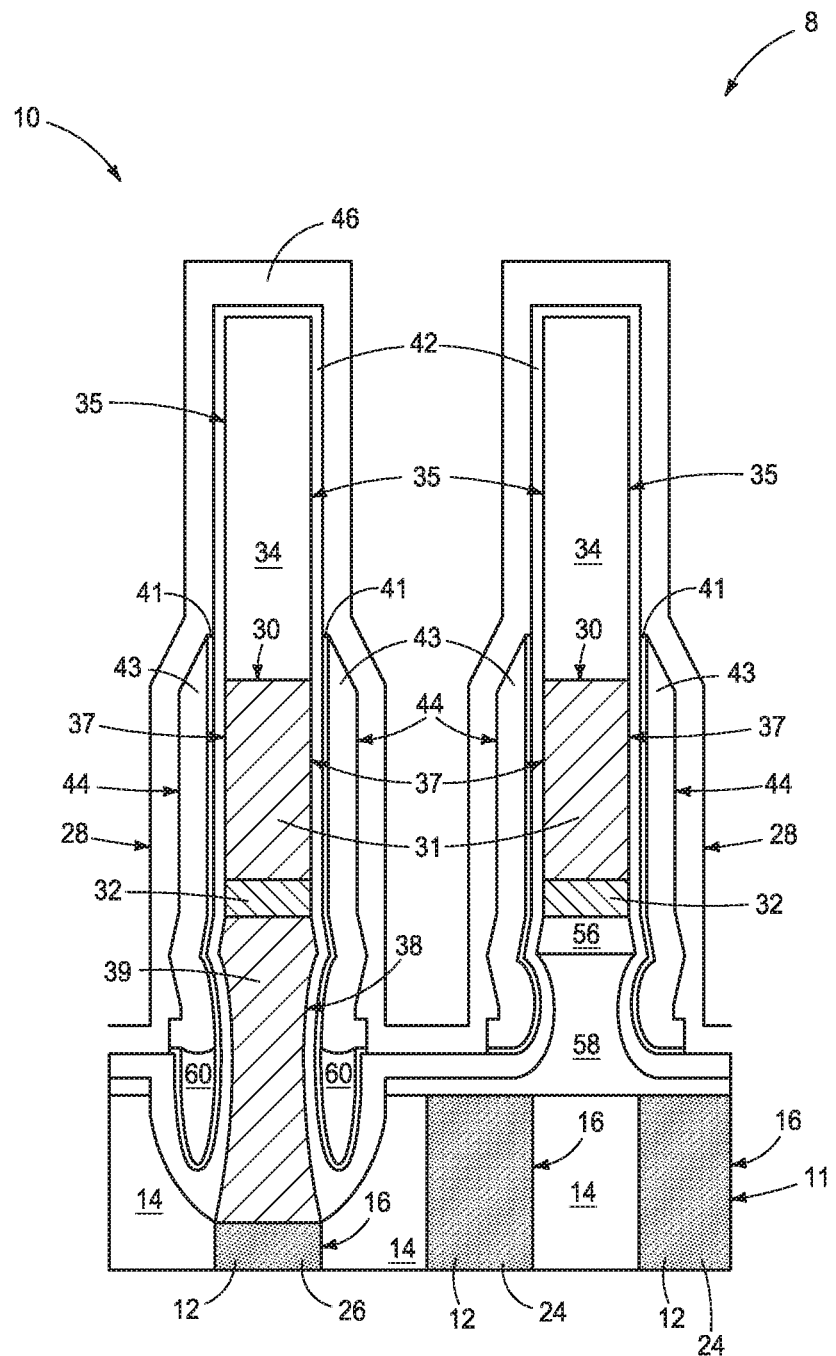
FIG. 19 is a view of the FIG. 18 substrate at a processing step subsequent to that shown by FIG. 18.

Referring to FIG. 19, third insulating material 46 has been deposited, for example by chemical vapor deposition. Such may serve to cover silicon dioxide-comprising second insulating material 44 during subsequent etching of other silicon dioxide material (not shown) elsewhere on the substrate and may thereby preclude material 44 from being etched in overcoming a problem which motivated an aspect of the invention as described in the "Background" section above.

Figure 20:
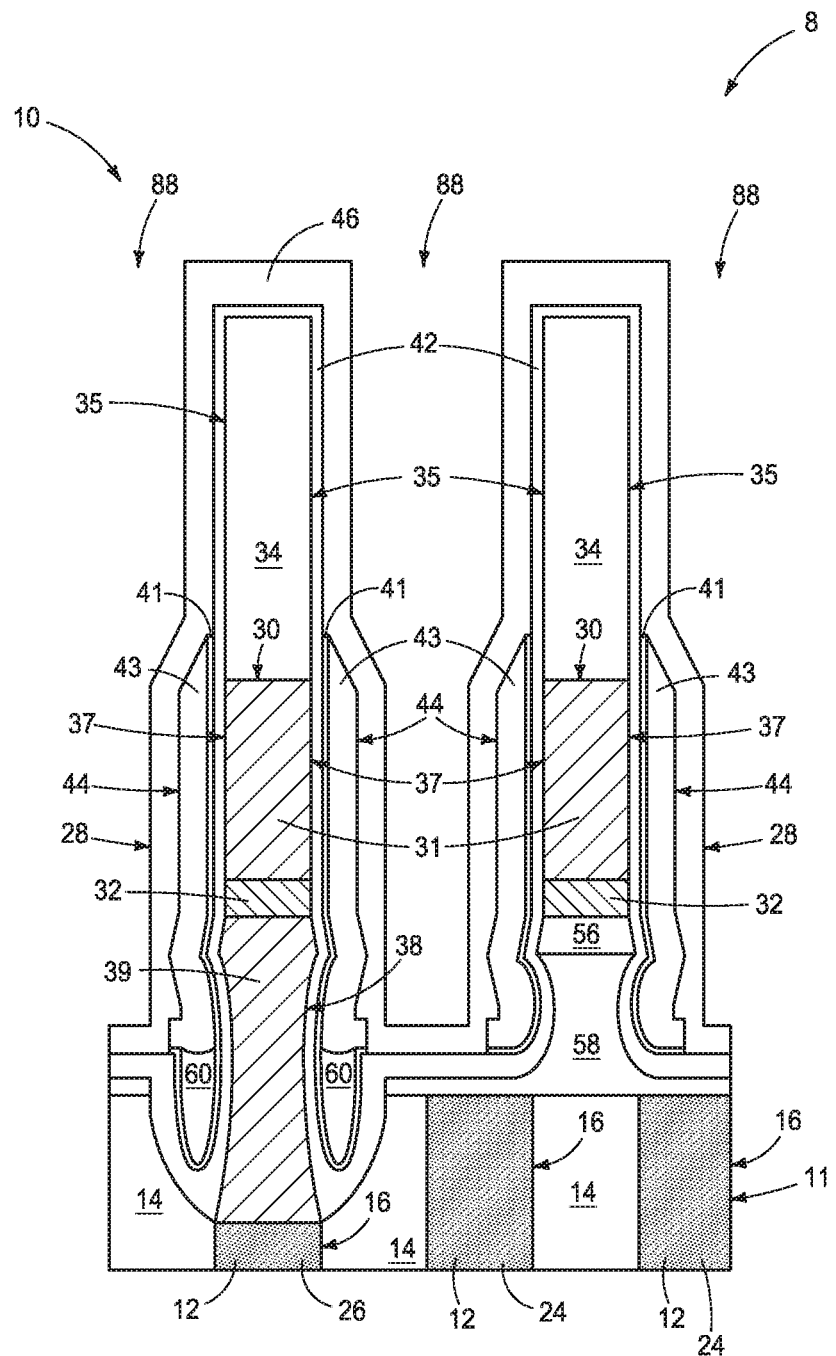
FIG. 20 is view of the FIG. 19 substrate at a processing step subsequent to that shown by FIG. 19.
Figure 21:
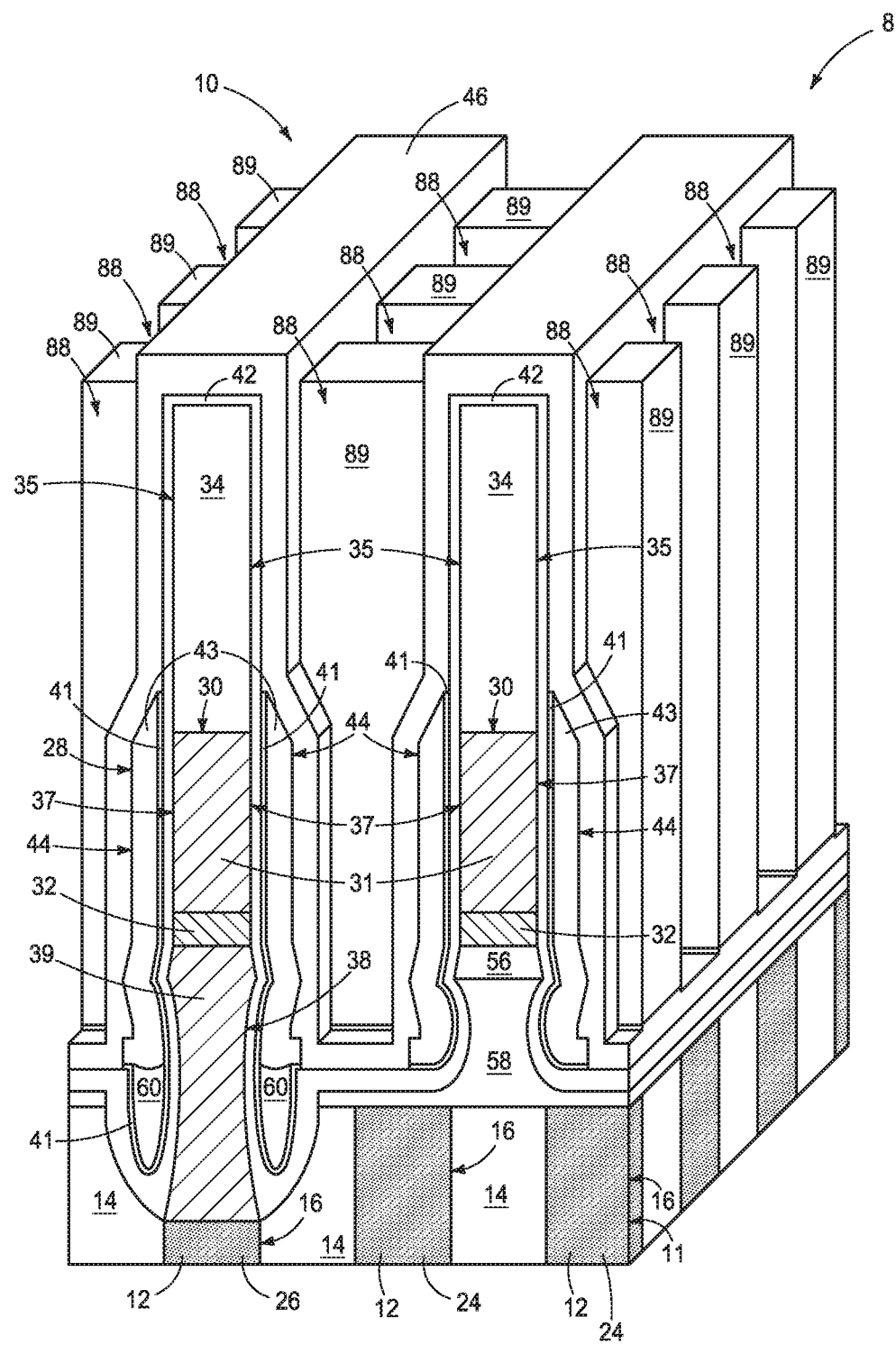
FIG. 21 is a perspective view of the FIG. 20 substrate.

Referring to FIGS. 20 and 21, dielectric material 89 (e.g., silicon dioxide) has been deposited and patterned into vertical pillars to leave void spaces 88 there-between. An example technique is photolithographic patterning and anisotropic etching.

Figure 22:
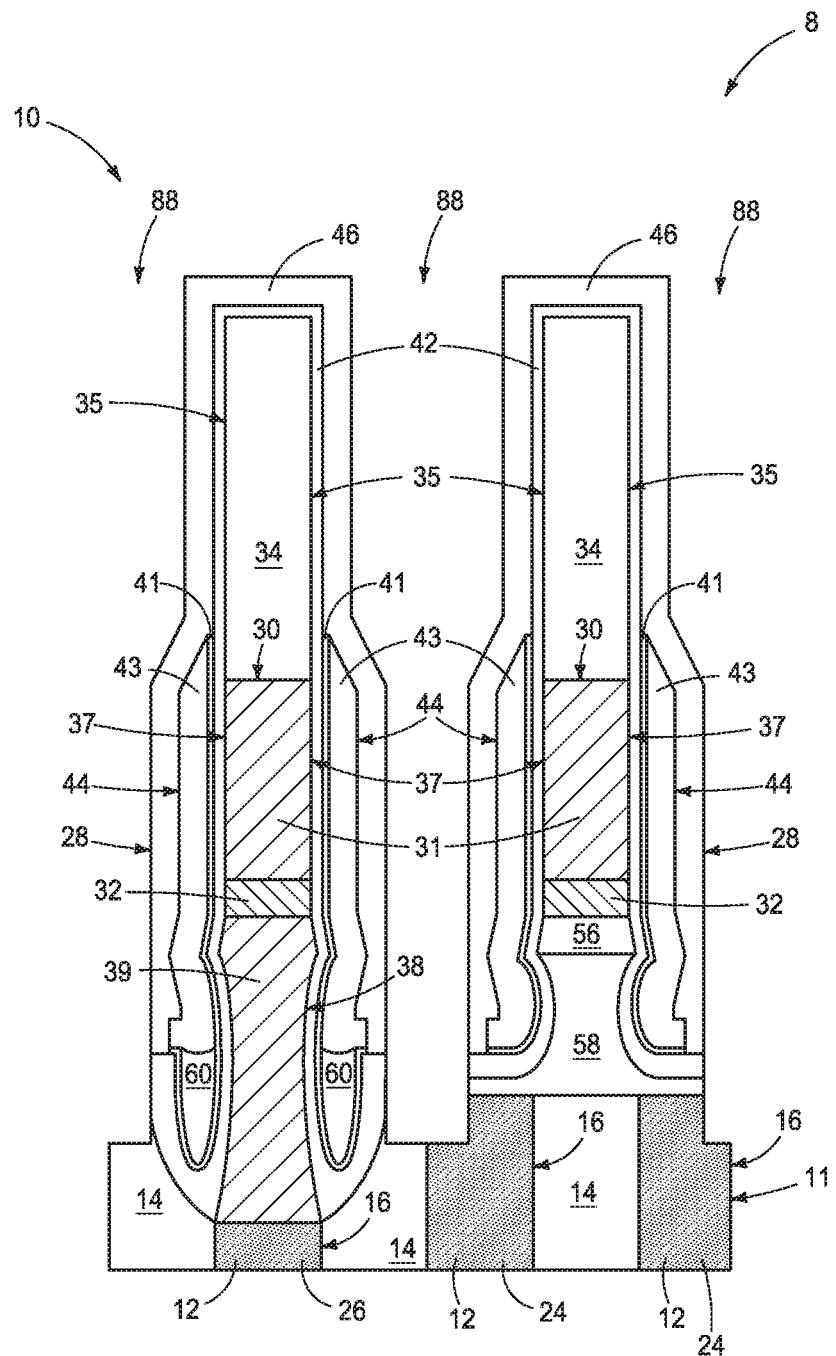
FIG. 22 is a view of the FIG. 20 substrate at a processing step subsequent to that shown by FIG. 20.

Referring to FIG. 22, third insulating material 46 and first insulating material 42 have been anisotropically etched to extend void spaces 88 between immediately-adjacent constructions 28 to underlying active area region 16.

Figure 23:
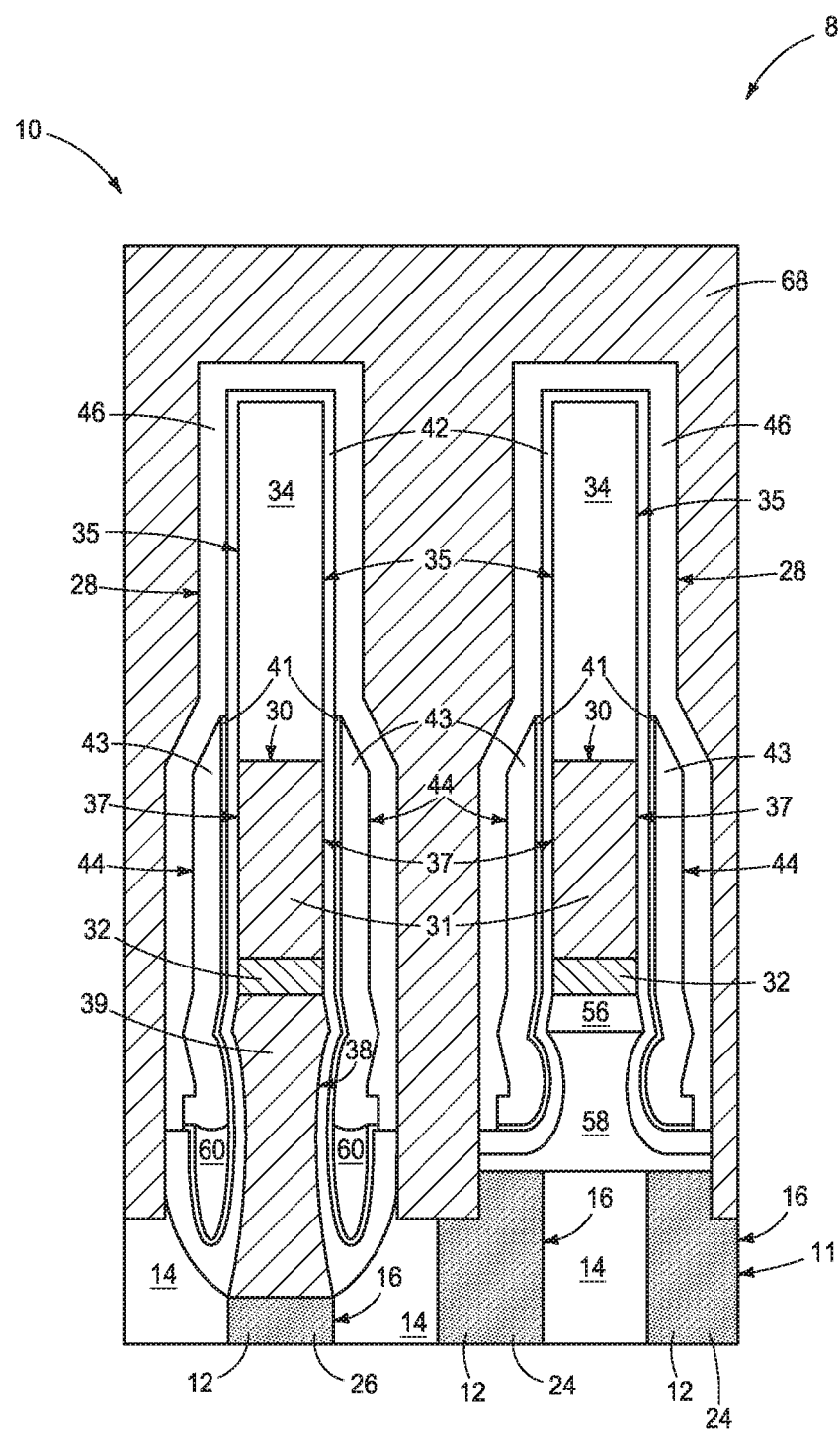
FIG. 23 is a view of the FIG. 22 substrate at a processing step subsequent to that shown by FIG. 22.
Figure 24:
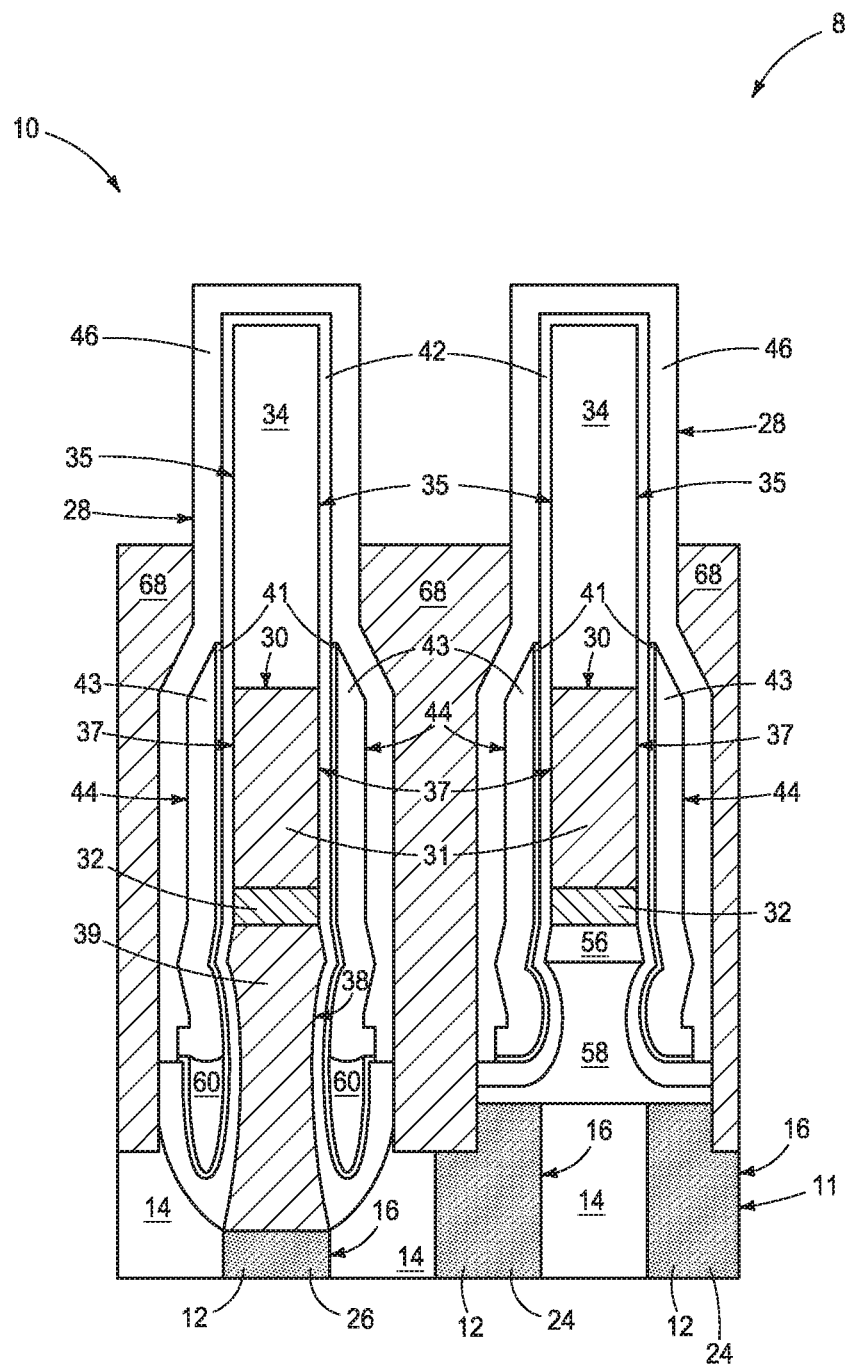
FIG. 24 is a view of the FIG. 23 substrate at a processing step subsequent to that shown by FIG. 23.

Referring to FIG. 23, conductive material 68 has been deposited into void spaces 88 (not numerically designated in FIG. 23), and then etched back as shown in FIG. 24. Subsequent processing may occur to produce the construction as shown in FIG. 1 to include example insulative material 56 and elevationally-extending-conductor material 64.

Any of the structural attributes described above with respect to structure embodiments may be found in method aspects and vice versa.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, a construction of integrated circuitry comprises a structure comprising conductive material having insulative material there-above. The conductive material and the insulative material respectively have opposing sides in a vertical cross-section. A first insulating material is laterally outward of the opposing sides of the conductive material in the vertical cross-section. A second insulating material is laterally outward of the first insulating material in the vertical cross-section. The second insulating material is of different composition from that of the first insulating material. The second insulating material laterally covers a lower portion of the opposing sides of the insulative material in the vertical cross-section. The second insulating material does not laterally cover an upper portion of the opposing sides of the insulative material in the vertical cross-section. A third insulating material is laterally outward of the second insulating material in the vertical cross-section. The third insulating material is of different composition from that of the second insulating material. The third insulating material laterally covers the lower portion and the upper portion of the opposing sides of the insulative material in the vertical cross-section.

In some embodiments, a construction of integrated circuitry comprises a pair of structures individually comprising a conductive line and insulative material there-above. The conductive line and the insulative material respectively have opposing sides in a vertical cross-section. Elevationally-extending-insulator material is along the opposing sides of the conductive line and the opposing sides of the insulative material in the vertical cross-section. The insulator material comprises a first insulating material laterally outward of the opposing sides of the conductive line and the insulative material in the vertical cross-section. A second insulating material is laterally outward of the first insulating material in the vertical cross-section. The second insulating material is of different composition from that of the first insulating material. The second insulating material laterally covers a lowest-most portion of the opposing sides of the insulative material in the vertical cross-section. The second insulating material does not laterally cover an uppermost portion of the opposing sides of the insulative material in the vertical cross-section. The second insulating material laterally covers all of the opposing sides of the conductive line in the vertical cross-section. A third insulating material is laterally outward of the second insulating material in the vertical cross-section. The third insulating material is of different composition from that of the second insulating material. The third insulating material laterally covers the lowest-most portion and the uppermost portion of the opposing sides of the insulative material in the vertical cross-section. The third insulating material laterally covers all of the opposing sides of the conductive line in the vertical cross-section. Elevationally-extending-conductor material is laterally between the pair of structures and along the insulator material in the vertical cross-section.

In some embodiments, a DRAM construction comprises a pair of structures individually comprising a digit line and insulative material there-above. The digit line and the insulative material respectively have opposing sides in a vertical cross-section. Elevationally-extending-insulator material is along the opposing sides of the conductive line and the opposing sides of the insulative material in the vertical cross-section. The insulator material comprises first silicon nitride laterally outward of the opposing sides of the digit line and the insulative material in the vertical cross-section. Silicon dioxide is laterally outward of the first silicon nitride in the vertical cross-section. The silicon dioxide laterally covers a lowest-most portion of the opposing sides of the insulative material in the vertical cross-section. The silicon dioxide does not laterally cover an uppermost portion of the opposing sides of the insulative material in the vertical cross-section. The silicon dioxide laterally covers all of the opposing sides of the digit line in the vertical cross-section. Second silicon nitride is laterally outward of the silicon dioxide in the vertical cross-section. The second silicon nitride laterally covers the lowest-most portion and the uppermost portion of the opposing sides of the insulative material in the vertical cross-section. The second silicon nitride laterally covers all of the opposing sides of the digit line in the vertical cross-section. An elevationally-extending conductor storage node via is laterally between the pair of structures and along the insulator material in the vertical cross-section. A capacitor is directly electrically coupled to the conductor storage node via.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A construction of integrated circuitry, comprising:
   a structure comprising a conductive material having an insulative material there-above, the conductive material and the insulative material respectively having opposing sides in a vertical cross-section;
   a first insulating material laterally outward of the opposing sides of the conductive material in the vertical cross-section;
   a second insulating material laterally outward of the first insulating material in the vertical cross-section, the second insulating material being solid and of different composition from that of the first insulating material, the second insulating material laterally covering a lower portion of the opposing sides of the insulative material in the vertical cross-section, the second insulating material not laterally covering an upper portion of the opposing sides of the insulative material in the vertical cross-section, the second insulting material having a top surface that is horizontal, the second insulating material having an upper surface adjacent the top surface that is angled from horizontal; and
   a third insulating material laterally outward of the second insulating material in the vertical cross-section, the third insulating material being of different composition from that of the second insulating material, the third insulating material laterally covering the lower portion and the upper portion of the opposing sides of the insulative material in the vertical cross-section, the third insulating material having an inner surface directly above the top surface of the second insulating material, said inner surface being angled from horizontal.

2. The construction of claim 1 wherein the first insulating material is laterally outward of the insulative material.

3. The construction of claim 2 wherein the first insulating material laterally covers all of the opposing sides of the insulative material in the vertical cross-section.

4. The construction of claim 1 wherein the first insulating material laterally covers all of the opposing sides of the conductive material in the vertical cross-section.

5. The construction of claim 1 wherein the insulative material and the first insulating material are of the same composition.

6. The construction of claim 1 wherein the second insulating material has a maximum thickness that is greater than that of the first insulating material.

7. The construction of claim 1 wherein the second insulating material has a maximum thickness that is greater than that of the third insulating material.

8. The construction of claim 1 wherein the third insulating material has a maximum thickness that is greater than that of the first insulating material.

9. The construction of claim 1 wherein the second insulating material has a maximum thickness that is greater than that of each of the first insulating material and the third insulating material, the third insulating material having a maximum thickness that is greater than that of the first insulating material.

10. The construction of claim 1 wherein the lower portion of the opposing sides of the insulative material in the vertical cross-section that is laterally covered by the second insulating material and by the third insulating material is the lowest-most portion of the opposing sides of the insulative material in the vertical cross-section.

11. The construction of claim 1 wherein the upper portion of the opposing sides of the insulative material in the vertical cross-section that is not laterally covered by the second insulating material is the uppermost portion of the opposing sides of the insulative material in the vertical cross-section.

12. The construction of claim 1 wherein the first insulating material and the third insulating material are of the same composition.

13. The construction of claim 1 wherein the second insulating material is directly against the first insulating material.

14. The construction of claim 1 wherein the third insulating material is directly against the second insulating material.

15. A construction of integrated circuitry, comprising:
    a pair of structures individually comprising a conductive line and an insulative material there-above, the conductive line and the insulative material respectively having opposing sides in a vertical cross-section;
    an elevationally-extending-insulator material along the opposing sides of the conductive line and the opposing sides of the insulative material in the vertical cross-section, the elevationally-extending-insulator material comprising:
    a first insulating material laterally outward of the opposing sides of the conductive line and the insulative material in the vertical cross-section;
    a second insulating material laterally outward of the first insulating material in the vertical cross-section, the second insulating material being solid and of different composition from that of the first insulating material, the second insulating material laterally covering a lowest-most portion of the opposing sides of the insulative material in the vertical cross-section, the second insulating material not laterally covering an uppermost portion of the opposing sides of the insulative material in the vertical cross-section, the second insulating material laterally covering all of the opposing sides of the conductive line in the vertical cross-section, the second insulting material having a top surface that is horizontal, the second insulating material having an upper surface adjacent the top surface that is angled from horizontal; and
    a third insulating material laterally outward of the second insulating material in the vertical cross-section, the third insulating material being of different composition from that of the second insulating material, the third insulating material laterally covering the lowest-most portion and the uppermost portion of the opposing sides of the insulative material in the vertical cross-section, the third insulating material laterally covering all of the opposing sides of the conductive line in the vertical cross-section, the third insulating material having an inner surface directly above the top surface of the second insulating material, said inner surface being angled from horizontal; and an elevationally-extending-conductor material laterally between the pair of structures and along the insulator material in the vertical cross-section.

16. The construction of claim 15 wherein the vertical cross-section is orthogonal to a longitudinal orientation of the conductive lines, and further comprising an elevationally-extending conductive via directly under at least one of the conductive lines of the pair of structures in the vertical cross-section.

17. The construction of claim 16 wherein only one of the conductive lines of the pair of structures has an elevationally-extending conductive via directly there-under in the vertical cross-section.

18. A DRAM construction comprising:
a pair of structures individually comprising a digit line and an insulative material there-above, the digit line and the insulative material respectively having opposing sides in a vertical cross-section;
an elevationally-extending-insulator material along the opposing sides of the digit line and the opposing sides of the insulative material in the vertical cross-section, the elevationally-extending-insulator material comprising:
  a first material comprising silicon nitride laterally outward of the opposing sides of the digit line and the insulative material in the vertical cross-section;
  a silicon dioxide laterally outward of the first material comprising silicon nitride in the vertical cross-section, the silicon dioxide laterally covering a lowest-most portion of the opposing sides of the insulative material in the vertical cross-section, the silicon dioxide not laterally covering an uppermost portion of the opposing sides of the insulative material in the vertical cross-section, the silicon dioxide laterally covering all of the opposing sides of the digit line in the vertical cross-section, the silicon dioxide having a top surface that is angled from horizontal; and
  a second material comprising silicon nitride laterally outward of the silicon dioxide in the vertical cross-section, the second material comprising silicon nitride laterally covering the lowest-most portion and the uppermost portion of the opposing sides of the insulative material in the vertical cross-section, the second material comprising silicon nitride laterally covering all of the opposing sides of the digit line in the vertical cross-section, the second material comprising silicon nitride having an inner surface directly above the top surface of the silicon dioxide, said inner surface being angled from horizontal;
an elevationally-extending conductor storage node via laterally between the pair of structures and along the insulator material in the vertical cross-section; and
a capacitor directly electrically coupled to the elevationally-extending conductor storage node via.

19. A construction of integrated circuitry, comprising:
a structure comprising a conductive material having an insulative material there-above, the conductive material and the insulative material respectively having opposing sides in a vertical cross-section;
a first insulating material laterally outward of the opposing sides of the conductive material and the insulative material in the vertical cross-section, the first insulating material being over a top surface of the insulative material in the vertical cross-section;
a second insulating material laterally outward of the first insulating material in the vertical cross-section, the second insulating material being solid and of different composition from that of the first insulating material, the second insulating material laterally covering a lower portion of the opposing sides of the insulative material in the vertical cross-section, the second insulating material not laterally covering an upper portion of the opposing sides of the insulative material in the vertical cross-section; and
a third insulating material laterally outward of the second insulating material in the vertical cross-section, the third insulating material being of different composition from that of the second insulating material, the third insulating material laterally covering the lower portion and the upper portion of the opposing sides of the insulative material in the vertical cross-section.

20. A construction of integrated circuitry, comprising:
a pair of structures individually comprising a conductive line and an insulative material there-above, the conductive line and the insulative material respectively having opposing sides in a vertical cross-section;
an elevationally-extending-insulator material along the opposing sides of the conductive line and the opposing sides of the insulative material in the vertical cross-section, the elevationally-extending-insulator material comprising:
  a first insulating material laterally outward of the opposing sides of the conductive line and the insulative material in the vertical cross-section, the first insulating material being over a top surface of the insulative material in the vertical cross-section;
  a second insulating material laterally outward of the first insulating material in the vertical cross-section, the second insulating material being solid and of different composition from that of the first insulating material, the second insulating material laterally covering a lowest-most portion of the opposing sides of the insulative material in the vertical cross-section, the second insulating material not laterally covering an uppermost portion of the opposing sides of the insulative material in the vertical cross-section, the second insulating material laterally covering all of the opposing sides of the conductive line in the vertical cross-section; and
  a third insulating material laterally outward of the second insulating material in the vertical cross-section, the third insulating material being of different composition from that of the second insulating material, the third insulating material laterally covering the lowest-most portion and the uppermost portion of the opposing sides of the insulative material in the vertical cross-section, the third insulating material laterally covering all of the opposing sides of the conductive line in the vertical cross-section; and
an elevationally-extending-conductor material laterally between the pair of structures and along the insulator material in the vertical cross-section.

21. A DRAM construction comprising:
- a pair of structures individually comprising a digit line and an insulative material there-above, the digit line and the insulative material respectively having opposing sides in a vertical cross-section;
- an elevationally-extending-insulator material along the opposing sides of the digit line and the opposing sides of the insulative material in the vertical cross-section, the elevationally-extending-insulator material comprising:
  - a first material comprising silicon nitride laterally outward of the opposing sides of the digit line and the insulative material in the vertical cross-section;
  - a silicon dioxide laterally outward of the first material comprising silicon nitride in the vertical cross-section, the silicon dioxide laterally covering a lowest-most portion of the opposing sides of the insulative material in the vertical cross-section, the silicon dioxide not laterally covering an uppermost portion of the opposing sides of the insulative material in the vertical cross-section, the silicon dioxide laterally covering all of the opposing sides of the digit line in the vertical cross-section; and
  - a second material comprising silicon nitride laterally outward of the silicon dioxide in the vertical cross-section, the second silicon nitride laterally covering all of the lowest-most portion and all of the uppermost portion of the opposing sides of the insulative material in the vertical cross-section, the second silicon nitride laterally covering all of the opposing sides of the digit line in the vertical cross-section;
- an elevationally-extending conductor storage node via laterally between the pair of structures and along the insulator material in the vertical cross-section; and
- a capacitor directly electrically coupled to the elevationally-extending conductor storage node via.

22. The construction of claim 1 wherein the upper surface is linearly straight.

* * * * *

UNITED STATES PATENT AND TRADEMARK OFFICE
CERTIFICATE OF CORRECTION

PATENT NO. : 10,679,996 B2  
APPLICATION NO. : 15/858263  
DATED : June 9, 2020  
INVENTOR(S) : Kazuyoshi Yuki and Takayoshi Tashiro Page 1 of 1

It is certified that error appears in the above-identified patent and that said Letters Patent is hereby corrected as shown below:

In the Claims

Column 9, Line 42 – Replace "insulting" with --insulating--

Column 10, Line 61 – Replace "insulting" with --insulating--

Signed and Sealed this  
Twenty-fifth Day of May, 2021

Drew Hirshfeld  
*Performing the Functions and Duties of the*  
*Under Secretary of Commerce for Intellectual Property and*  
*Director of the United States Patent and Trademark Office*